US009653450B2

(12) United States Patent
Huang et al.

(10) Patent No.: US 9,653,450 B2
(45) Date of Patent: May 16, 2017

(54) ELECTROSTATIC DISCHARGE PROTECTION SEMICONDUCTOR DEVICE

(71) Applicant: UNITED MICROELECTRONICS CORP., Hsin-Chu (TW)

(72) Inventors: Chung-Yu Huang, Tainan (TW); Kuan-Cheng Su, Taipei (TW); Tien-Hao Tang, Hsinchu (TW); Ping-Jui Chen, Pingtung County (TW); Po-Ya Lai, Changhua County (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 14/938,850

(22) Filed: Nov. 12, 2015

(65) Prior Publication Data
US 2017/0110446 A1 Apr. 20, 2017

(30) Foreign Application Priority Data

Oct. 15, 2015 (TW) .............................. 104133798 A

(51) Int. Cl.
H01L 27/02 (2006.01)
H01L 29/06 (2006.01)
H01L 29/78 (2006.01)

(52) U.S. Cl.
CPC ...... *H01L 27/0255* (2013.01); *H01L 29/0653* (2013.01); *H01L 29/7819* (2013.01); *H01L 29/7851* (2013.01)

(58) Field of Classification Search
None
See application file for complete search history.

(56) References Cited

U.S. PATENT DOCUMENTS

| 5,623,156 | A * | 4/1997 | Watt | H01L 27/0251 257/173 |
| 6,365,932 | B1 * | 4/2002 | Kouno | H01L 27/0255 257/133 |
| 7,655,980 | B1 * | 2/2010 | Chao | H01L 29/0847 257/335 |
| 7,675,724 | B2 | 3/2010 | Ker et al. | |
| 2002/0149059 | A1 * | 10/2002 | Ker | H01L 27/0277 257/355 |
| 2014/0167105 | A1 * | 6/2014 | Salcedo | H01L 27/0262 257/140 |

* cited by examiner

Primary Examiner — Hoang-Quan Ho
(74) Attorney, Agent, or Firm — Winston Hsu; Scott Margo

(57) ABSTRACT

An ESD protection semiconductor device includes a substrate, a gate set formed on the substrate, a source region and a drain region formed in the substrate respectively at two sides of the gate set, and at least a first doped region formed in the drain region. The source region and the drain region include a first conductivity type, and the first doped region includes a second conductivity type. The first conductivity type and the second conductivity type are complementary to each other. The first doped region is electrically connected to a ground potential.

14 Claims, 17 Drawing Sheets

ELECTROSTATIC DISCHARGE PROTECTION SEMICONDUCTOR DEVICE

BACKGROUND OF THE INVENTION

1. Field of the Invention

The invention relates to an electrostatic discharge (hereinafter abbreviated as ESD) protection semiconductor device.

2. Description of the Prior Art

With the advancement of technology, the development of semiconductor process is ongoing. A modern chip is therefore allowed to have a plurality of various electronic circuits configured within. For example, the integrated circuits (ICs) integrated in the chip(s) can be divided into core circuits and input/output (hereinafter abbreviated as I/O) circuits, and the core circuits and the I/O circuits are respectively driven by different power supply sources with different voltages. And for receiving the externally provided power, pads for core circuits and I/O circuits are required.

However, it is found that electrostatic charges are easily transferred to the inner circuits in the chip by those pads during processes such as manufacturing, testing, packaging, and delivering, etc. The electrostatic charges impact and damage the inner circuits in the chip, and this unwanted condition is named electrostatic discharge (ESD). As products based on ICs become more delicate, they also become more vulnerable to the impacts from external environment. And thus, it is assumed that ESD is a constant threat to the modern electronics. Models related to ESD tolerance are divided into human body model (HBM) and machine model (MM). For commercial IC products, the general ESD specification is required that IC products must pass these tests, for example, MM ESD tolerance greater than 100V. As a countermeasure against to the ESD issue, there have been proposed ESD protection circuits/devices. Typically, during a normal IC operation, the ESD protection device is turned off. However when an ESD event occurs, the ESD protection device must be quickly triggered, so that the ESD current is bypassed from the inner circuit. There is therefore a continuing need in the semiconductor processing art to develop an ESD protection device having lower trigger voltage which can be quickly turned on in order to render immediate protection to the inner circuit. That is, lower threshold voltage (Vt) for the ESD protection device is required. In the meantime, demand for improving device robustness is increased.

SUMMARY OF THE INVENTION

According to the claimed invention, and ESD protection semiconductor device is provided. The ESD protection semiconductor device includes a substrate, a gate set formed on the substrate, a source region and a drain region formed in the substrate respectively at two sides of the gate set, and at least a first doped region formed in the drain region. The source region and the drain region include a first conductivity type, and the first doped region includes a second conductivity type. And the first conductivity type and the second conductivity type are complementary to each other. The first doped region is electrically connected to a ground potential.

According to the claimed invention, another ESD protection semiconductor device is provided. The ESD protection semiconductor device includes a substrate, a gate set formed on the substrate, a source region and a drain region formed in the substrate respectively at two sides of the gate set, and at least a doped region formed in the source region. The source region and the drain region include a first conductivity type, and the doped region includes a second conductivity type. And the first conductivity type and the second conductivity type are complementary to each other. The doped region is electrically connected to a ground potential.

According to the claimed invention, still another ESD protecting semiconductor device is provided. The ESD protection semiconductor device includes a substrate, a gate set formed on the substrate, a source region and a drain region formed in the substrate respectively at two sides of the gate set, and at least a first doped region formed in the drain region. The source region, the drain region and the first doped region include a first conductivity type. And the first doped region is electrically connected to a ground potential.

According to the ESD protection semiconductor device provided by the present invention, the first doped region including the first conductivity type or, alternatively, the second conductivity type is formed in the source region or in the drain region. And the first doped region is electrically connected to the ground potential. Accordingly, a diode or a bipolar junction transistor (hereinafter abbreviated as BJT) is formed in the substrate, therefore the threshold voltage of the ESD protection semiconductor device is reduced while the turn-on speed and the device robustness of the ESD protection semiconductor device are improved. Furthermore, the ESD protection semiconductor device provided by the present invention includes the gate set, and the gate set can include single gate, multi gate, or multi gate group. Therefore, the ESD protection semiconductor device provided by the present invention is able to be integrated into single-gate metal-oxide-semiconductor (hereinafter abbreviated as MOS) transistor device, cascode transistor device, multi-gate MOS transistor, and fin field effect transistor (hereinafter abbreviated as FinFET). Additionally, by forming well regions of different conductivity types in the substrate, the ESD protection semiconductor device provided by the present invention is able to be integrated with lateral-diffusion metal-oxide-semiconductor (hereinafter abbreviated as LDMOS) transistor approach. In other words, the ESD protection semiconductor device provided by the present invention is able to be integrated with various transistor approaches, thus product flexibility and functionality of the ESD protection semiconductor device are both improved.

These and other objectives of the present invention will no doubt become obvious to those of ordinary skill in the art after reading the following detailed description of the preferred embodiment that is illustrated in the various figures and drawings.

DETAILED DESCRIPTION

Figure 1A:
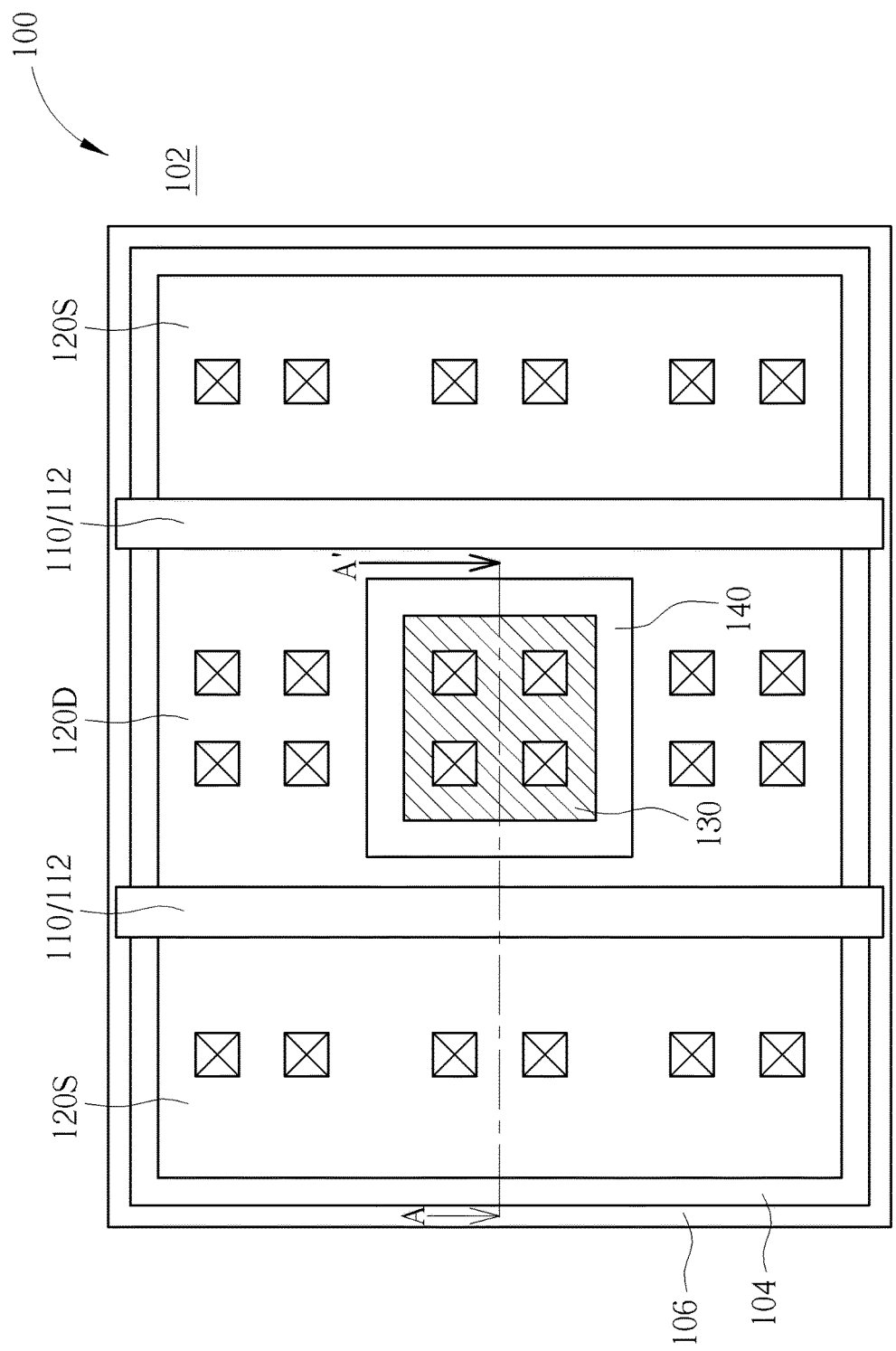
FIG. 1A is a schematic drawing illustrating a layout structure of an ESD protection semiconductor device provided by a first preferred embodiment of the present invention.
Figure 1B:
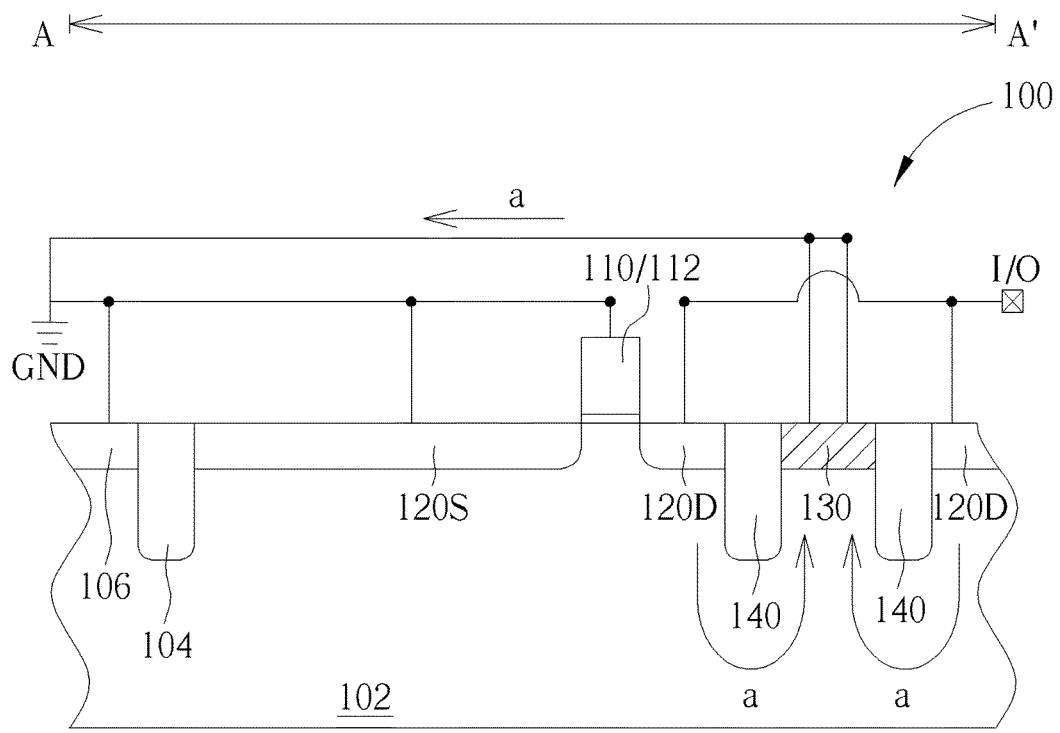
FIG. 1B is a schematic drawing illustrating the ESD protection semiconductor device provided by the first preferred embodiment and also is a cross-sectional view taken along a Line A-A' of FIG. 1A.
Figure 1C:
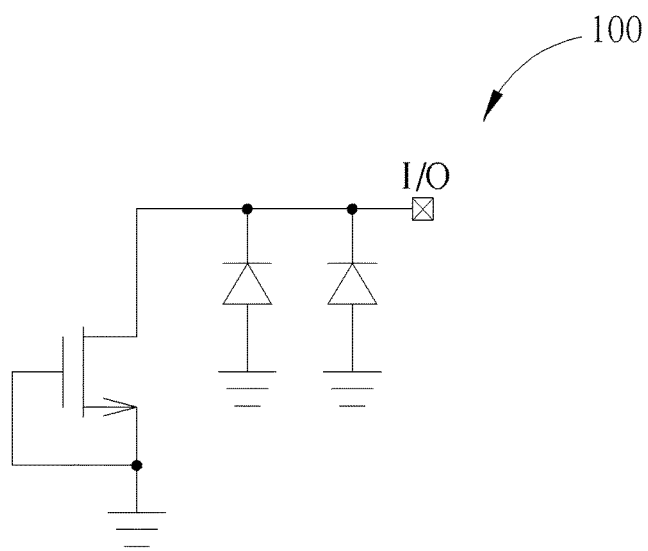
FIG. 1C is a circuit diagram of the ESD protection semiconductor device provided by the first preferred embodiment.

Please refer to FIGS. 1A-1C, wherein FIG. 1A is a schematic drawing illustrating a layout structure of an ESD protection semiconductor device provided by a first preferred embodiment of the present invention, FIG. 1B is a schematic drawing illustrating the ESD protection semiconductor device provided by the first preferred embodiment and also is a cross-sectional view taken along a Line A-A' of FIG. 1A, and FIG. 1C is a circuit diagram of the ESD protection semiconductor device provided by the first preferred embodiment. As shown in FIG. 1A and FIG. 1B, the ESD protection semiconductor device 100 provided by the preferred embodiment includes a substrate, and the substrate includes a well region 102. A gate set 110 is positioned on the substrate and the well region 102. In the preferred embodiment, the gate set 110 includes a single gate structure 112. It is well-known to those skilled in the art that the single gate structure 112 includes a gate conductive layer and a gate dielectric layer, and since materials for the gate conductive layer and the gate dielectric layer are well-known to those skilled in the art, those details are omitted in the interest of brevity. According to the preferred embodiment, the ESD protection semiconductor device 100 further includes a source region 120S and a drain region 120D formed in the substrate/the well region 102 respectively at two sides of the gate set 110 (that is the single gate structure 112). The source region 120S and the drain region 120D include a first conductivity type while the well region 102 includes a second conductivity type, and the first conductivity type and the second conductivity type are complementary to each other. For example, the first conductivity type is an n type and the second conductivity type is a p type in the preferred embodiment. However, it should be easily realized to those skilled in the art that the first conductivity type can be the p type and the second conductivity type can be the n type. Accordingly, the preferred embodiment provides an n-source region 120S and an n-drain region 120D formed in a p-well region 102. Furthermore, the ESD protection semiconductor device 100 includes an isolation structure 104 and a guard ring 106 including the second conductivity type. The isolation structure 104 and the guard ring 106 surround the ESD protection semiconductor device 100 and electrically isolate the ESD protection semiconductor device 100 from other device. In the preferred embodiment, the isolation structure 104 preferably includes a shallow trench isolation (hereinafter abbreviated as STI) structure, but not limited to this.

Please still refer to FIG. 1A and FIG. 1B. The ESD protection semiconductor device 100 provided by the preferred embodiment further includes at least a first doped region 130 formed in the drain region 120D. It is noteworthy that though the first doped region 130 is formed in the drain region 120D, the first doped region 130 is physically spaced apart from the drain region 120D by a first blocking structure 140. As shown in FIG. 1A and FIG. 1B, the first blocking structure 140 surrounds the first doped region 130 and therefore isolates the first doped region 130 from the drain region 120D. In the preferred embodiment, the first blocking structure 140 includes a STI, however the first blocking structure 140 can include dummy gate or salicide block (hereinafter abbreviated as SAB) layer. More important, the first blocking structure 140 can be a mixed type blocking structure and the details about the mixed type first blocking structure are exemplarily shown in FIG. 5 and will be detailed thereafter. It is noteworthy that the first doped region 130 includes the second conductivity type. That is, the preferred embodiment provides a p-typed first doped region 130 formed in the n-drain region 120D.

Please refer to FIG. 1B and FIG. 1C. More important, the first doped region 130 formed in the drain region 120D is electrically connected to a ground potential GND. According to the preferred embodiment, the gate set 110 (that is the single gate structure 112), the source region 120S and the guard ring 106 are electrically connected to the ground potential GND, and the drain region 120D is electrically connected to an input/output pad I/O. As shown in FIG. 1B and FIG. 1C, when an ESD event occurs, the ESD surges will be diverted to the ground by the gate set 110/112, which is electrically connected to the ground potential GND. More important, the n-drain region 120D, the p-well region 102 and the p-typed first doped region 130 construct a diode. Consequently, the ESD current is bypassed from the drain region 120D to the first doped region 130 and then to the ground potential GND as arrows "a" depicted. Briefly speaking, the preferred embodiment provides at least a diode for bypassing the ESD currents.

Figure 2:
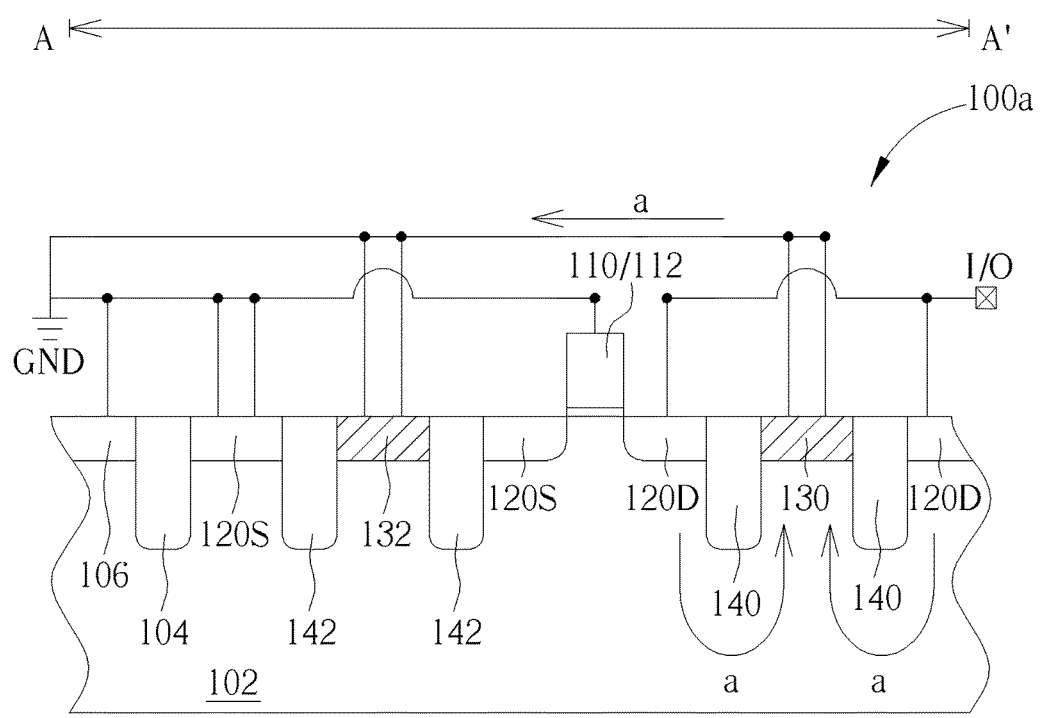
FIG. 2 is a schematic drawing illustrating an ESD protection semiconductor device provided by a modification to the first referred embodiment.

Please refer to FIG. 2, which is a schematic drawing illustrating an ESD protection semiconductor device provided by a modification to the first preferred embodiment. It should be noted that elements the same in the present modification and the first preferred embodiment are designated by the same numerals and include the same material choice and electrical relationships, therefore those details are omitted for simplicity. As shown in FIG. 2, the difference between the modification and the preferred embodiments is detailed: The ESD protection semiconductor device 100a provided by the present modification further includes a second doped region 132 formed in the source region 120S. And the second doped region 132 includes the second conductivity type. That is, the modification provides a p-typed second doped region 132 formed in the n-source region 120S.

Figure 13:
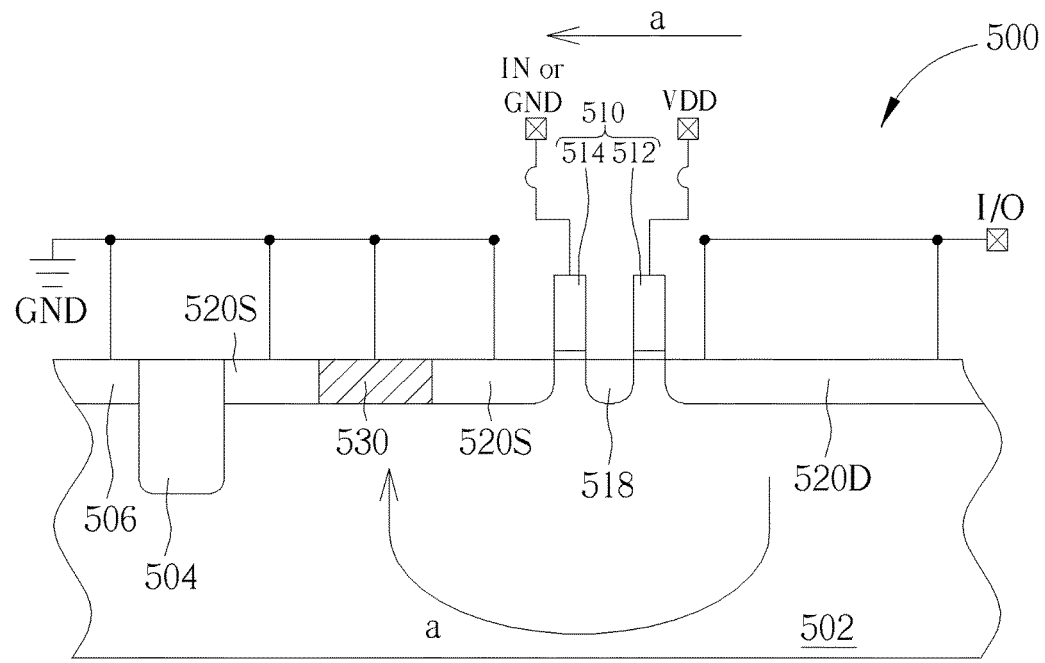
FIG. 13 is a schematic drawing illustrating an ESD protection semiconductor device provided by a modification to the present invention.

As shown in FIG. 2, though the second doped region 132 is formed in the source region 120S, the second doped region 132 is physically spaced apart from the source region 120S by a second blocking structure 142: the second blocking structure 142 surrounds the second doped region 132 and therefore isolates the second doped region 132 from the source region 120S. In the preferred embodiment, the second blocking structure 142 includes a STI, however the second blocking structure 142 can include dummy gate or SAB layer. More important, the second blocking structure 142 can be a mixed type blocking structure and the details about the mixed type second blocking structure are exemplarily shown in FIG. 5 and will be detailed thereafter. It is noteworthy that the second doped region 132 is also electrically connected to the ground potential GND according to the modification. Since both of the second doped region 132 and the source region 120S are electrically connected to the ground potential GND, the blocking structure originally disposed in between the second doped region 132 and the source region 120S can be eliminated as shown in FIG. 13, and will be detailed thereafter.

Accordingly, the ESD protection semiconductor device 100/100a provided by the preferred embodiment and its modification is a single-gate MOS transistor device including at least a diode. Consequently, the ESD currents can be bypassed by the diode, and thus the threshold voltage of the ESD protection semiconductor device 100/100a is efficaciously reduced and the turn-on speed is improved. Since the diode serves as the bypass for ESD, damage caused by the ESD event is avoided and thus device robustness of the ESD protection semiconductor device 100/100a is improved. More important, no leakage is found when the ESD protection semiconductor device 100/100a is turned off. Additionally, according to the preferred embodiment, formation of the first doped region 130 and the second doped region 132 can be integrated in the state-of-the-art semiconductor manufacturing process without increasing process complexity and cost.

Figure 3A:
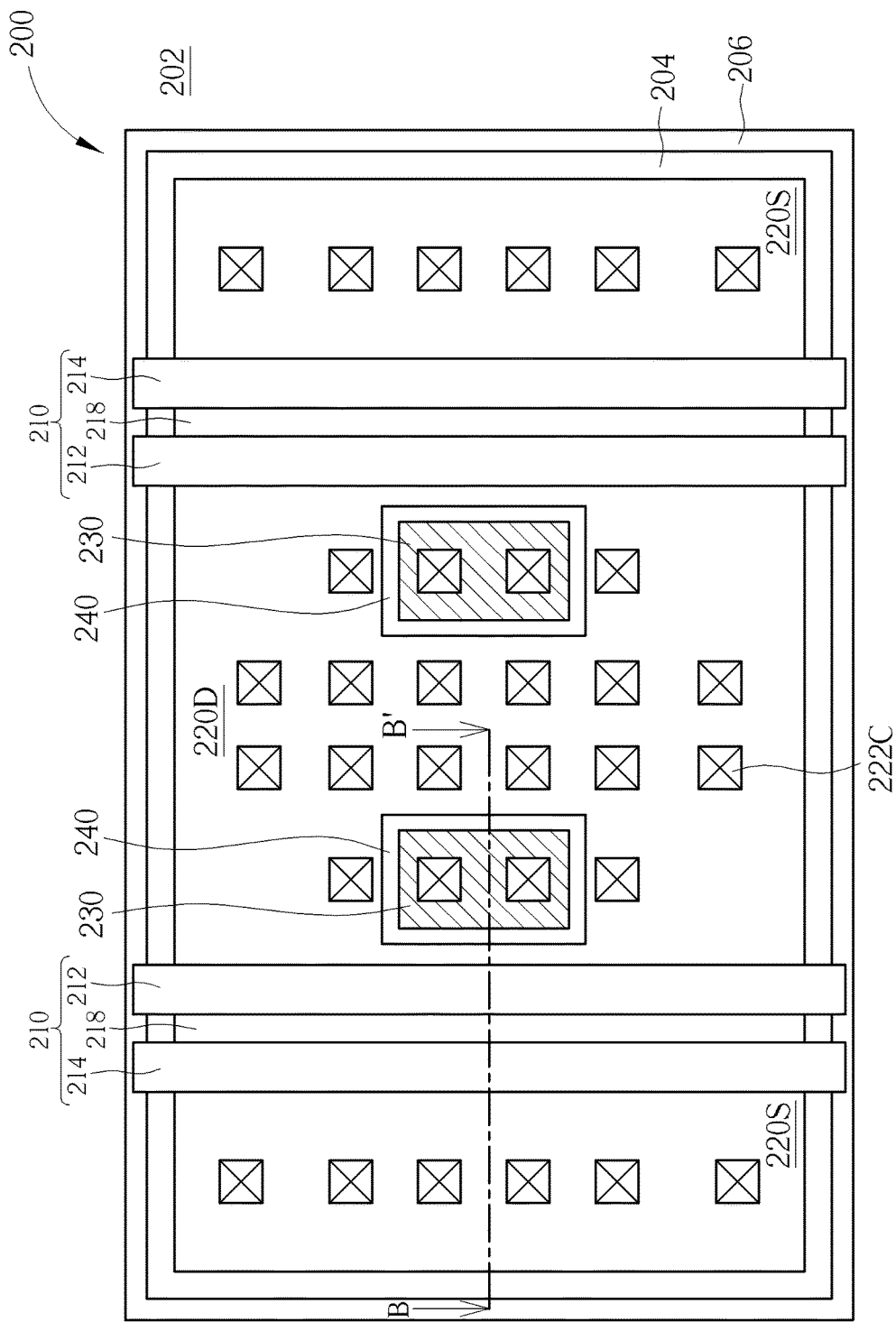
FIG. 3A is a schematic drawing illustrating a layout structure of an ESD protection semiconductor device provided by a second preferred embodiment of the present invention.
Figure 3B:
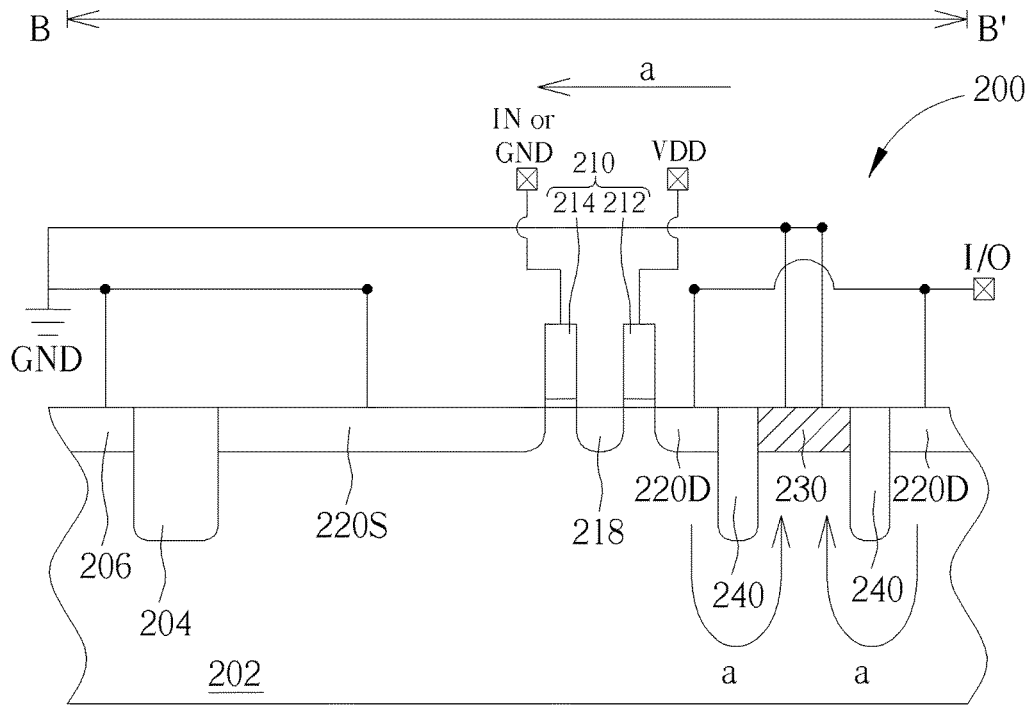
FIG. 3B is a schematic drawing illustrating the ESD protection semiconductor device provided by the second preferred embodiment and also is a cross-sectional view taken along a Line B-B' of FIG. 3A.
Figure 3C:
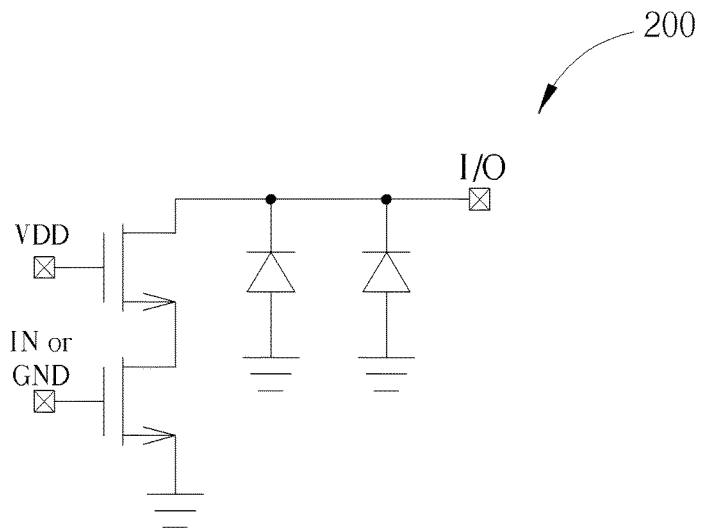
FIG. 3C is a circuit diagram of the ESD protection semiconductor device provided by the second preferred embodiment.

Please refer to FIGS. 3A-3C, wherein FIG. 3A is a schematic drawing illustrating a layout structure of an ESD protection semiconductor device provided by a second preferred embodiment of the present invention, FIG. 3B is a schematic drawing illustrating the ESD protection semiconductor device provided by the second preferred embodiment and also is a cross-sectional view taken along a Line B-B' of FIG. 3A, and FIG. 3C is a circuit diagram of the ESD protection semiconductor device provided by the second preferred embodiment. As shown in FIG. 3A and FIG. 3B, the ESD protection semiconductor device 200 provided by the preferred embodiment includes a substrate, and the substrate includes a well region 202. A gate set 210 is positioned on the substrate and the well region 202. In the preferred embodiment, the gate set 210 includes a first gate structure 212, a second gate structure 214 and a third doped region 218. As shown in FIG. 3A and FIG. 3B, the third doped region 218 is positioned in between the first gate structure 212 and the second gate structure 214. Therefore the first gate structure 212 and the second gate structure 214 are physically spaced apart from each other by the third doped region 218. However, the first gate structure 212 and the second gate structure 214 are electrically connected to each other by the third doped region 218. It is well-known to those skilled in the art that the first gate structure 212 and the second gate structure 214 respectively include a gate conductive layer and a gate dielectric layer, and since materials for the gate conductive layer and the gate dielectric layer are well-known to those skilled in the art, those details are omitted in the interest of brevity. According to the preferred embodiment, the ESD protection semiconductor device 200 further includes a source region 220S and a drain region 220D formed in the substrate/the well region 202 respectively at two sides of the gate set 210. As shown in FIG. 3A and FIG. 3B, the first gate structure 212 is positioned in between the third doped region 218 and the drain region 220D while the second gate structure 214 is positioned in between the third doped region 218 and the source region 220S. The source region 220S, the drain region 220D and the third doped region 218 include a first conductivity type while the well region 202 includes a second conductivity type, and the first conductivity type and the second conductivity type are complementary to each other. For example, the first conductivity type is an n type and the second conductivity type is a p type in the preferred embodiment. However, as mentioned above, the first conductivity type can be the p type and the second conductivity type can be the n type. Furthermore, the ESD protection semiconductor device 200 includes an isolation structure 204 and a guard ring 206 including the second conductivity type. The isolation structure 204 and the guard ring 206 surround the ESD protection semiconductor device 200 and electrically isolate the ESD protection semiconductor device 200 from other device. In the preferred embodiment, the isolation structure 204 preferably includes a STI structure, but not limited to this.

Please still refer to FIG. 3A and FIG. 3B. The ESD protection semiconductor device 200 provided by the preferred embodiment further includes at least a first doped region 230 formed in the drain region 220D. As shown in FIG. 3A, the first doped region 230 is positioned in between drain contact plugs 222C and the gate set 210. It is noteworthy that though the first doped region 230 is formed in the drain region 220D, the first doped region 230 is spaced apart from the drain region 220D by a first blocking structure 240. As shown in FIG. 3A and FIG. 3B, the first blocking structure 240 surrounds the first doped region 230 and therefore isolates the first doped region 230 from the drain region 220D. In the preferred embodiment, the first blocking structure 240 includes a STI structure. However, the first blocking structure 240 can include dummy gate or SAB layer. As mentioned above, the first doped region 230 includes the second conductivity type. That is, the preferred embodiment provides a p-typed first doped region 230 formed in the n-drain region 220D.

Please refer to FIG. 3B and FIG. 3C. More important, the first doped region 230 formed in the drain region 220D is electrically connected to a ground potential GND. According to the preferred embodiment, the first gate structure 212 of the gate set 210 is electrically connected to a power supply pad (Vdd pad) VDD while the second gate structure 214 of the gate set 210 is electrically connected to a ground potential GND or a signal input pad IN. The source region 220S and the guard ring 206 are electrically connected to a ground potential GND, and the drain region 220D is electrically connected to an input/output pad I/O. As shown in FIG. 3B and FIG. 3C, when an ESD event occurs, the ESD surges will be diverted to the ground by the second gate structure 214, which is electrically connected to the ground potential GND. More important, the n-drain region 220D, the p-well region 202 and the p-typed first doped region 230 construct a diode. Consequently, the ESD current is bypassed from the drain region 220D to the first doped region 230, which is electrically connected to the ground potential GND, as arrows "a" depicted. Briefly speaking, the preferred embodiment provides at least a diode for bypassing the ESD currents.

Figure 4:
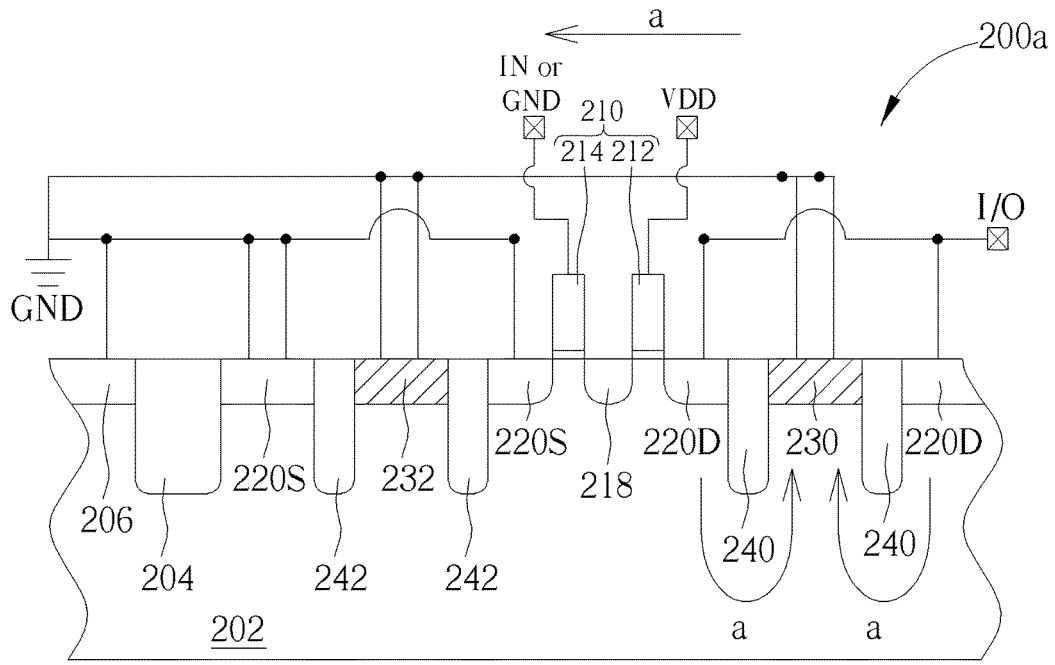
FIG. 4 is a schematic drawing illustrating an ESD protection semiconductor device provided by a modification to the second referred embodiment.

Please refer to FIG. 4, which is a schematic drawing illustrating an ESD protection semiconductor device provided by a modification to the second preferred embodiment. It should be noted that elements the same in the present modification and the second preferred embodiment are designated by the same numerals and include the same material choice and electrical relationships, therefore those details are omitted for simplicity. As shown in FIG. 4, the difference between the modification and the preferred embodiments is detailed: The ESD protection semiconductor device 200a provided by the present modification further includes a second doped region 232 formed in the source region 220S. And the second doped region 232 includes the second conductivity type. That is, the modification provides a p-typed second doped region 232 formed in the n-source region 220S.

As shown in FIG. 4, though the second doped region 232 is formed in the source region 220S, the second doped region 232 is physically spaced apart from the source region 220S by a second blocking structure 242: the second blocking structure 242 surrounds the second doped region 232 and therefore isolates the second doped region 232 from the source region 220S. In the preferred embodiment, the second blocking structure 242 includes a STI, however the second blocking structure 242 can include dummy gate or SAB layer. More important, the second blocking structure 242 can be a mixed type blocking structure and the details about the mixed type second blocking structure are exemplarily shown in FIG. 5 and will be detailed thereafter. It is noteworthy that the second doped region 232 is also electrically connected to the ground potential GND according to the modification. Since both of the second doped region 232 and the source region 220S are electrically connected to the ground potential GND, the blocking structure originally disposed in between the second doped region 232 and the source region 220S can be eliminated as shown in FIG. 13, and will be detailed thereafter.

Accordingly, the ESD protection semiconductor device 200/200a provided by the preferred embodiment and its modification is a cascade transistor device including at least a diode. Consequently, the ESD currents can be bypassed by the diode, and thus the threshold voltage of the ESD protection semiconductor device 200/200a is efficaciously reduced and the turn-on speed is improved. Since the diode serves as the bypass for ESD, damage caused by ESD event is avoided and thus device robustness of the ESD protection semiconductor device 200/200a is improved. Accordingly, the ESD positive pulse voltage of the ESD protection semiconductor device 200/200a in machine model (MM) is increased from 100V to 275V while the ESD negative pulse voltage of the ESD protection semiconductor device 200/200a in machine model is increased from −175V to −375V. That is, tolerance of the ESD protection semiconductor device 200/200a is improved to 114%-175%. More important, no leakage is found when the ESD protection semiconductor device 200/200a is turned off. Additionally, according to the preferred embodiment, formation of the first doped region 230 and the second doped region 232 can be integrated in the state-of-the-art semiconductor manufacturing process without increasing process complexity and cost.

Figure 5:
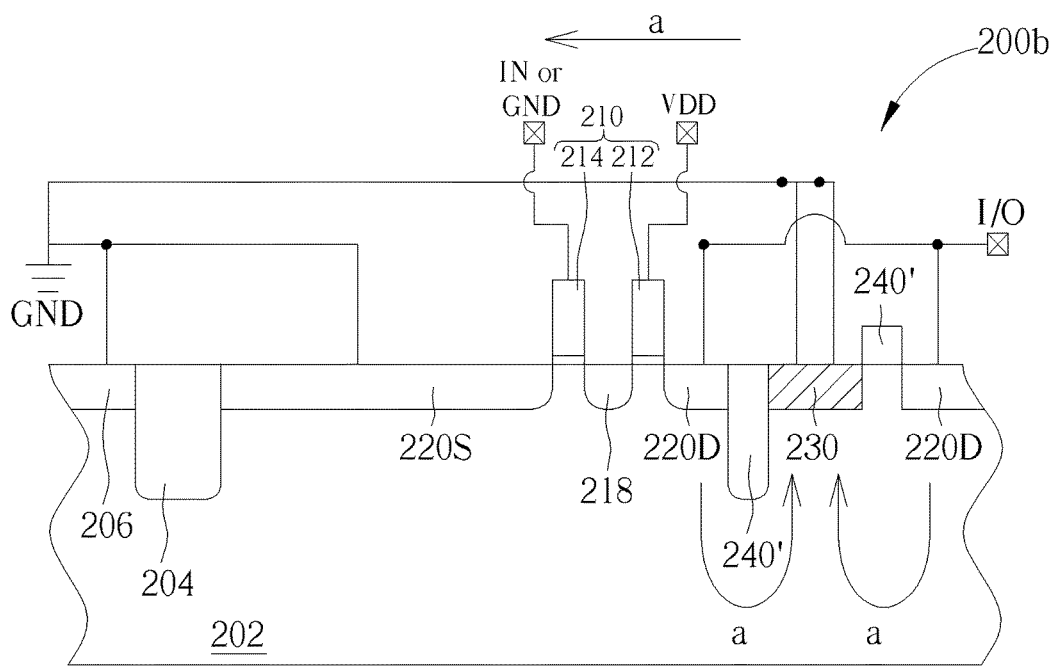
FIG. 5 is a schematic drawing illustrating an ESD protection semiconductor device provided by a modification to the present invention.

Please refer to FIG. 5, which is a schematic drawing illustrating an ESD protection semiconductor device provided by a modification to the present invention. It should be noted that elements the same in the present modification and the second preferred embodiment are designated by the same numerals and include the same material choice and electrical relationships, therefore those details are omitted for simplicity. More important, the present modification is provided not only for the second preferred embodiment, but also for the first preferred embodiment and the following provided preferred embodiments. The difference between the modification and the preferred embodiments is detailed: According to the ESD protection semiconductor device 200b provided by the modification, the first blocking structure includes a mixed type blocking structure 240'. Specifically, the mixed type blocking structure 240' can include a STI-dummy gate mixed blocking structure or a STI-SAB mixed blocking structure. It should be noted that in the modification, the mixed type blocking structure 240' preferably includes the STI at the side near the gate set 210 such that electrical isolation is ensured. According to the modification, the dummy gate or the SAB can serve as implant mask and thus no doped region is formed under the dummy gate or the SAB. Therefore, as shown in FIG. 5, the first doped region 230 is isolated from the drain region 220D by the mixed type blocking structure 240' and the substrate 202 formed underneath.

In the same concept, in some modifications that a second doped region 232 is formed in the source region 220S, the second blocking structure surrounding the second doped region 232 can include a mixed type blocking structure 242'. Furthermore, the mixed type blocking structure 242' preferably includes the STI at the side near the gate set 210 such that electrical isolation is ensured. According to the modification, the dummy gate or the SAB can serve as implant mask and thus no doped region is formed under the dummy gate or the SAB. Therefore, the second doped region 232 is isolated from the source region 220S by the mixed type blocking structure 242' and the substrate 202 formed underneath. However, since both of the second doped region 232 and the source region 220S are electrically connected to the ground potential GND, the mixed type blocking structure 242' can be eliminated as mentioned above.

Figure 6:
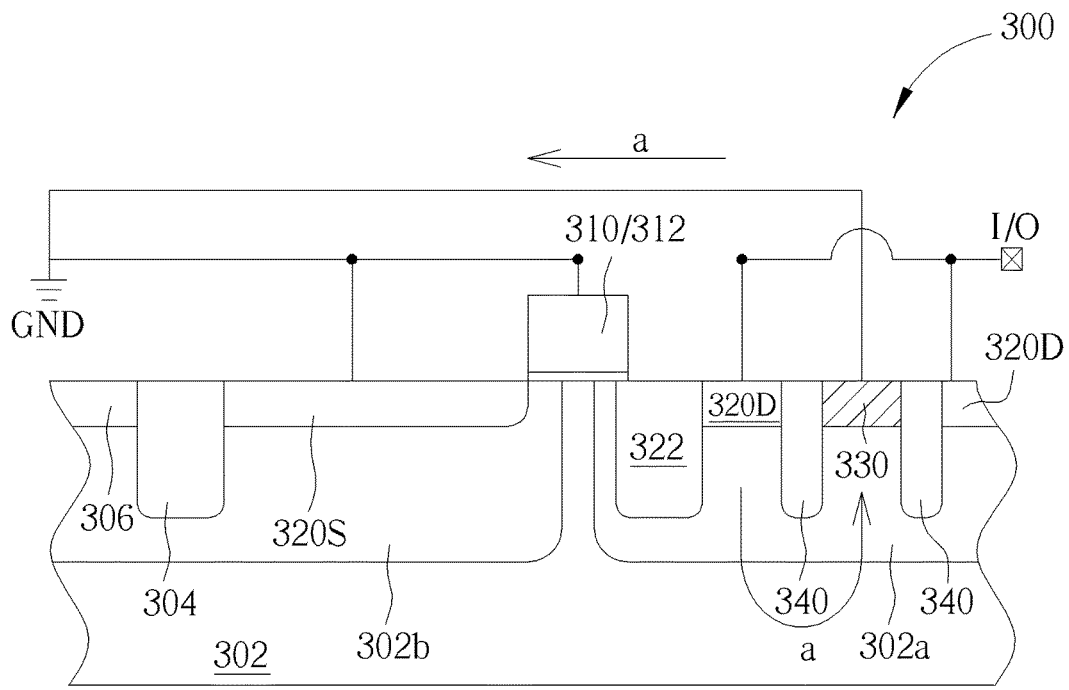
FIG. 6 is a schematic drawing illustrating an ESD protection semiconductor device provided by a third preferred embodiment of the present invention.

Please refer to FIG. 6, which is a schematic drawing illustrating an ESD protection semiconductor device provided by a third preferred embodiment of the present invention. As shown in FIG. 6, the ESD protection semiconductor device 300 provided by the preferred embodiment includes a p-typed substrate 302, and the substrate 302 includes a first well region 302a and a second well region 302b. The first well region 302a and the second well region 302b are spaced apart from each other by the substrate 302. The first well region 302a includes a first conductivity type, and the second well region 302b and the substrate 302 includes a second conductivity type. And the first conductivity type and the second conductivity type are complementary to each other. In the preferred embodiment, the first conductivity type is an n type and the second conductivity type is a p type. However, as mentioned above, it should be easily realized to those skilled in the art that the first conductivity type can be the p type and the second conductivity type can be the n type. A gate set 310 is positioned on the substrate 302. In the preferred embodiment, the gate set 310 includes a single gate structure 312. As shown in FIG. 6, the single gate structure 312 is positioned in between the first well region 302a and the second well region 302b. Furthermore, the single gate structure 312 overlaps a portion of the first well region 302a and a portion of the second gate structure 302b, respectively. It is well-known to those skilled in the art that the single gate structure 312 includes a gate conductive layer and a gate dielectric layer, and since materials for the gate conductive layer and the gate dielectric layer are well-known to those skilled in the art, those details are omitted in the interest of brevity. Additionally, the ESD protection semiconductor device 300 further includes an isolation structure 322 formed in the first well region 302a, and the gate set 310 (that is the single gate structure 312) covers at least a portion of the isolation structure 322. According to the preferred embodiment, the ESD protection semiconductor device 300 further includes a source region 320S and a drain region 320D formed in the substrate 302 respectively at two sides of the gate set 310. Particularly, the source region 320S is positioned in the second well region 302b and the drain region 320D is positioned in the first well region 302a. The source region 320S and the drain region 320D include the first conductivity type. Furthermore, the ESD protection semiconductor device 300 includes an isolation structure 304 and a guard ring 306 including the second conductivity type. The isolation structure 304 and the guard ring 306 surround the ESD protection semiconductor device 300 and electrically isolate the ESD protection semiconductor device 300 from other device. In the preferred embodiment, the isolation structure 304 preferably includes a STI structure, but not limited to this.

Please still refer to FIG. 6. The ESD protection semiconductor device 300 provided by the preferred embodiment further includes at least a first doped region 330 formed in the drain region 320D. Since the drain region 320D is formed in the first well region 302a, it is taken that the first doped region 330 is also formed in the first well region 302a. It is noteworthy that though the first doped region 330 is formed in the drain region 320D, the first doped region 330 is spaced apart from the drain region 320D by a first blocking structure 340. As shown in FIG. 6, the first blocking structure 340 surrounds the first doped region 330 and therefore isolates the first doped region 330 from the drain region 320D. In the preferred embodiment, the first blocking structure 340 includes a STI structure. However, the first blocking structure 340 can include dummy gate, SAB layer, STI-dummy gate mixed blocking structure, or STI-SAB mixed blocking structure. Furthermore, the first doped region 330 includes the second conductivity type.

More important, the first doped region 330 formed in the drain region 320D is electrically connected to a ground potential GND as shown in FIG. 6. Furthermore, the gate set 310 (that is the single gate structure 312), the source region 320S and the guard ring 306 are electrically connected to a ground potential GND, and the drain region 320D is electrically connected to an input/output pad I/O. As shown in FIG. 6, when an ESD event occurs, the ESD surges will be diverted to the ground by the gate set 310 (that is the single gate structure 312) which is electrically connected to the ground potential GND. More important, the n-drain region 320D, the n-typed first well region 302a, and the p-typed first doped region 330 construct a diode. Consequently, the ESD current is bypassed from the drain region 320D to the first doped region 330, which is electrically connected to the ground pad GND, as arrow "a" depicted. Briefly speaking, the preferred embodiment provides at least a diode for bypassing the ESD currents.

Figure 7:
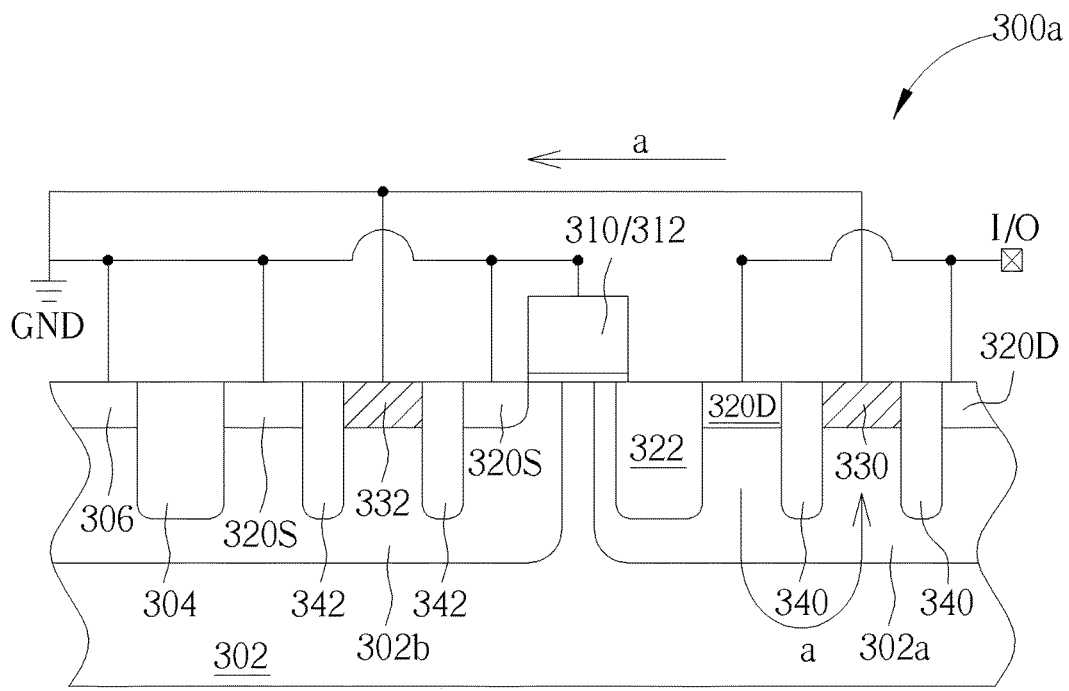
FIG. 7 is a schematic drawing illustrating an ESD protection semiconductor device provided by a modification to the third embodiment.

Please refer to FIG. 7, which is a schematic drawing illustrating an ESD protection semiconductor device provided by a modification to the third preferred embodiment. It should be noted that elements the same in the present modification and the third preferred embodiment are designated by the same numerals and include the same material choice and electrical relationships, therefore those details are omitted for simplicity. As shown in FIG. 7, the difference between the modification and the preferred embodiments is detailed: The ESD protection semiconductor device 300a provided by the present modification further includes a second doped region 332 formed in the source region 320S, and the second doped region 332 includes the second conductivity type. That is, the preferred embodiment provides a p-typed second doped region 332.

As shown in FIG. 7, though the second doped region 332 is formed in the source region 320S, the second doped region 332 is physically spaced apart from the source region 320S by a second blocking structure 342: the second blocking structure 342 surrounds the second doped region 332 and therefore isolates the second doped region 332 from the source region 320S. In the preferred embodiment, the second blocking structure 342 includes a STI, however the second blocking structure 342 can include dummy gate or SAB layer. More important, the second blocking structure 342 can be a mixed type blocking structure as mentioned above. It is noteworthy that the second doped region 332 is also electrically connected to the ground potential GND according to the modification. Since both of the second doped region 332 and the source region 320S are electrically connected to the ground potential GND, the blocking structure originally disposed in between the second doped region 332 and the source region 320S can be eliminated as shown in FIG. 13, and will be detailed thereafter.

Accordingly, the ESD protection semiconductor device 300/300a provided by the preferred embodiment is a LDMOS transistor including at least a diode. Consequently, the ESD currents can be bypassed by the diode, and thus the threshold voltage of the ESD protection semiconductor device 300/300a is efficaciously reduced and the turn-on speed is improved. Since the diode serves as the bypass for ESD, damage caused by ESD event is avoided and thus device robustness of the ESD protection semiconductor device 300/300a is improved. More important, no leakage is found when the ESD protection semiconductor device 300/300a is turned off. Additionally, according to the preferred embodiment, formation of the first doped region 330 and the second doped region 332 can be integrated in the state-of-the-art semiconductor manufacturing process without increasing process complexity and cost.

Figure 8:
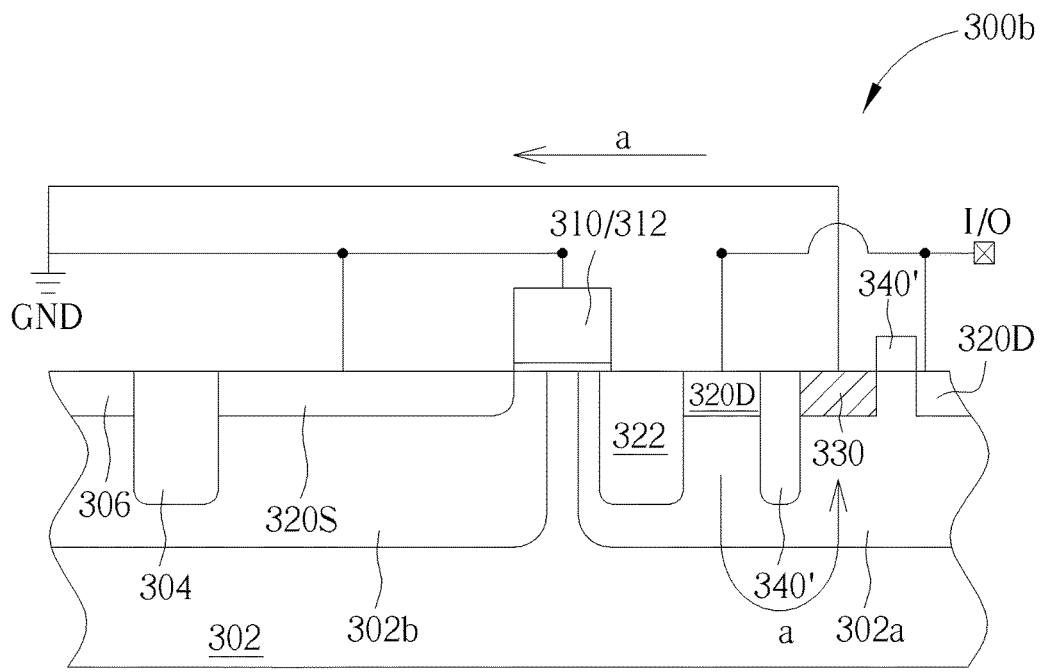
FIG. 8 is a schematic drawing illustrating an ESD protection semiconductor device provided by another modification to the third preferred embodiment.

Please refer to FIG. 8, which is a schematic drawing illustrating an ESD protection semiconductor device provided by another modification to the third preferred embodiment. It should be noted that elements the same in the present modification and the third preferred embodiment are designated by the same numerals and include the same material choice and electrical relationships, therefore those details are omitted for simplicity. The difference between the modification and the preferred embodiments is detailed: According to the ESD protection semiconductor device 300b provided by the modification, the first blocking structure includes a mixed type blocking structure 340'. Specifically, the mixed type blocking structure 340' can include a STI-dummy gate mixed blocking structure or a STI-SAB mixed blocking structure. It should be noted that in the modification, the mixed type blocking structure 340' preferably includes the STI at the side near the gate set 310 such that electrical isolation is ensured. According to the modification, the dummy gate or the SAB can serve as implant mask and thus no doped region is formed under the dummy gate or the SAB. Therefore, as shown in FIG. 8, the first doped region 330 is isolated from the drain region 320D by the mixed type blocking structure 340' and the substrate 302 formed underneath.

In the same concept, in some modifications that a second doped region 332 is formed in the source region 320S, the second blocking structure (not shown) surrounding the second doped region 332 can include the abovementioned mixed type blocking structure. Furthermore, the mixed type second blocking structure preferably includes the STI at the side near the gate set 310 such that electrical isolation is ensured. According to the modification, the dummy gate or the SAB can serve as implant mask and thus no doped region is formed under the dummy gate or the SAB. Therefore, the second doped region 332 is isolated from the source region 320S by the mixed type blocking structure and the substrate 302 formed underneath. However, since both of the second doped region 332 and the source region 320S are electrically connected to the ground potential GND, the blocking structure originally disposed in between the second doped region 332 and the source region 320S can be eliminated as mentioned above.

Figure 9:
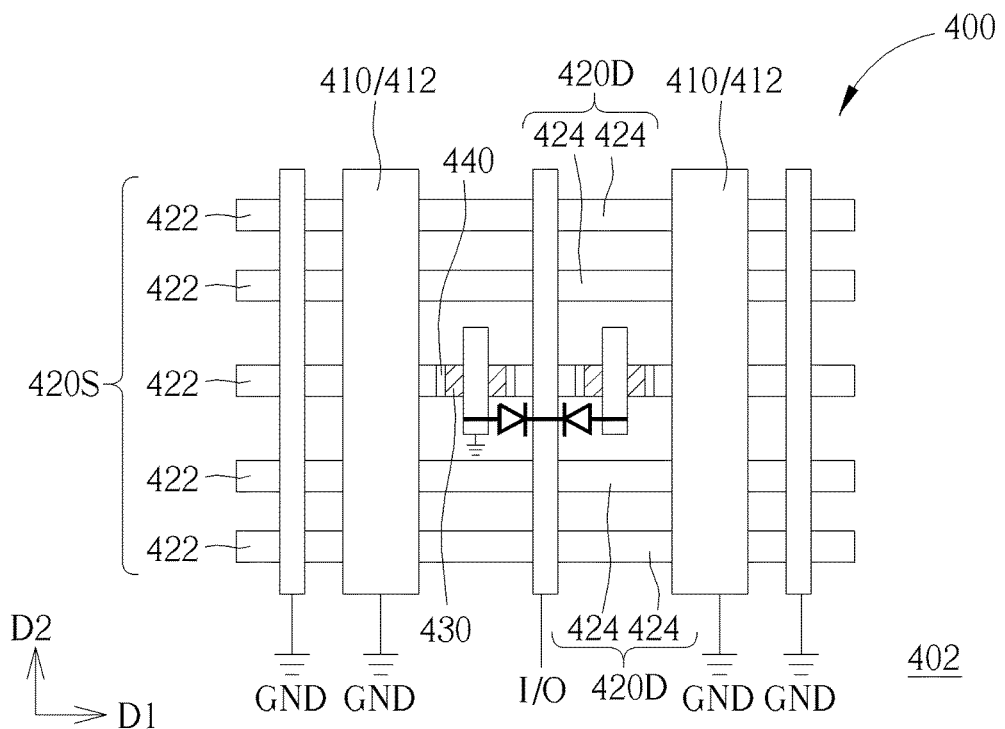
FIG. 9 is a schematic drawing illustrating a layout structure of an ESD protection semiconductor device provided by a fourth preferred embodiment of the present invention.

Please refer to FIG. 9, which is a schematic drawing illustrating a layout structure of an ESD protection semiconductor device provided by a fourth preferred embodiment of the present invention. As shown in FIG. 9, the ESD protection semiconductor device 400 provided by the preferred embodiment includes a substrate 402, and a gate set 410 is positioned on the substrate 402. In the preferred embodiment, the gate set 410 includes a single gate structure 412. It is well-known to those skilled in the art that the single gate structure 412 includes a gate conductive layer and a gate dielectric layer, and since materials for the gate conductive layer and the gate dielectric layer are well-known to those skilled in the art, those details are omitted in the interest of brevity. Additionally, the gate set 410 can include two gate structures, three gate structures, or the gate group(s) as mentioned above. The amount and arrangement of the gate set 410 can be modified as mentioned above, and thus details are all omitted for simplicity. As shown in FIG. 9, the ESD protection semiconductor device 400 further includes a source region 420S and a drain region 420D formed in the substrate 402 respectively at two sides of the gate set 410. It is noteworthy that according to the preferred embodiment, the source region 420S includes a plurality of source fins 422 and the drain region 420D includes a plurality of drain fins 424. As shown in FIG. 9, the source fins 422 are parallel with each other, and the drain fins 424 are parallel with each other. In the preferred embodiment, the source fins 422 and the drain fins 424 can be formed on the substrate 402 by performing multiple patterning process, such as, for example but not limited to, double patterning process. The source fins 422 and the drain fins 424 are extended along a first direction D1, and arranged along a second direction D2. The first direction D1 is perpendicular to the second direction D2. The gate set 410 is extended along the second direction D2. Furthermore, the gate set 410 covers a portion of the fins.

Please still refer to FIG. 9. At least a first doped fin 430 is formed in the drain region 420D. As shown in FIG. 9, the first doped fin 430 is parallel with the drain fins 424. Furthermore, the first doped fin 430 is physically spaced apart and electrically isolated from the drain fins 424 by an isolation structure 440. The source region 420S (including all of the source fins 422), the drain region 420D (including all of the drain fins 424) include a first conductivity type while the first doped fin 430 and the substrate 402 include a second conductivity type, and the first conductivity type and the second conductivity type are complementary to each other. For example, the first conductivity type is an n type and the second conductivity type is a p type in the preferred embodiment, but not limited to this.

More important, the first doped fin 430 formed in the drain region 420D is electrically connected to a ground potential GND as shown in FIG. 9. Furthermore, the gate set 410 (that is the single gate structure 412) and the source region 420S are electrically connected to a ground potential GND, and the drain region 420D is electrically connected to an input/output pad I/O. As shown in FIG. 9, when an ESD event occurs, the ESD surges will be diverted to the ground by the gate set 410/412, which is electrically connected to the ground potential GND. More important, the n-drain region 420D, the p-substrate 402 and the p-typed first doped fin 430 construct a diode. Consequently, the ESD current is bypassed from the drain region 420D to the first doped fin 430, which is electrically connected to the ground potential GND. Briefly speaking, the preferred embodiment provides at least a diode for bypassing the ESD currents.

Figure 10:
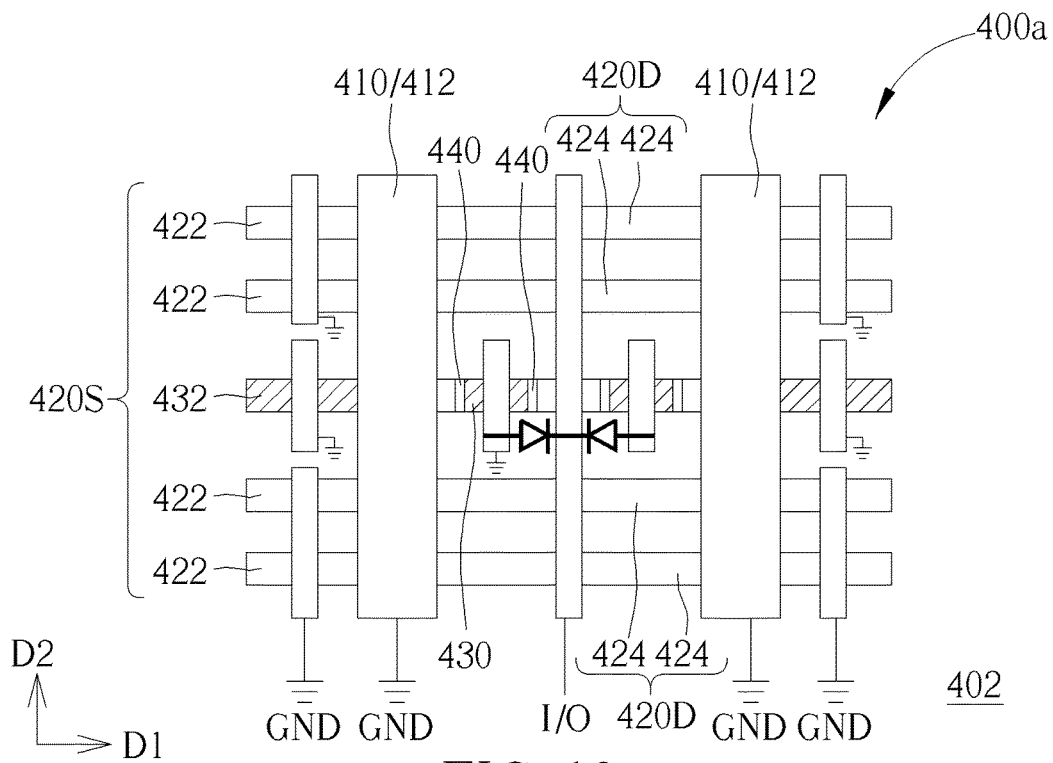
FIG. 10 is a schematic drawing illustrating a layout structure of an ESD protection semiconductor device provided by a modification to the fourth preferred embodiment.

Please refer to FIG. 10, which is a schematic drawing illustrating an ESD protection semiconductor device provided by a modification to the fourth preferred embodiment. It should be noted that elements the same in the present modification and the fourth preferred embodiment are designated by the same numerals and include the same material choice and electrical relationships, therefore those details are omitted for simplicity. As shown in FIG. 10, the difference between the modification and the preferred embodiments is detailed: The ESD protection semiconductor device 400a provided by the present modification further includes a second doped fin 432 formed in the source region 420S. And the second doped fin 432 includes the second conductivity type. As shown in FIG. 10, the second doped fin 420 is parallel with the source fins 422. It is noteworthy that the second doped fin 432 is physically spaced apart and electrically isolated from the source fins 422 in the modification. More important, the second doped fin 432 is electrically connected a ground potential GND.

Accordingly, the ESD protection semiconductor device 400/400a provided by the preferred embodiment is a FinFET including at least a diode. Consequently, the ESD currents can be bypassed by the diode, and thus the threshold voltage of the ESD protection semiconductor device 400/400a is efficaciously reduced and the turn-on speed is improved. Since the diode serves as the bypass for ESD, damage caused by ESD event is avoided and thus device robustness of the ESD protection semiconductor device 400/400a is improved. More important, no leakage is found when the ESD protection semiconductor device 400/400a is turned off. Additionally, according to the preferred embodiment, formation of the first doped fin 430 and the second doped fin 432 can be integrated in the state-of-the-art semiconductor manufacturing process without increasing process complexity and cost.

Figure 11:
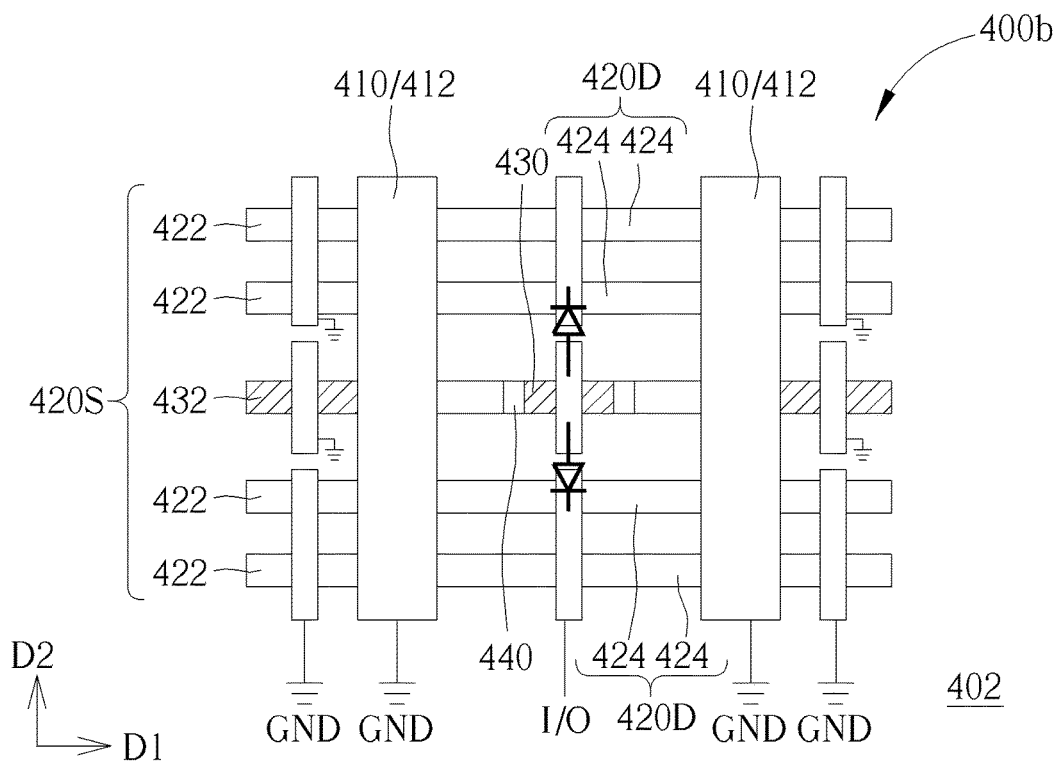
FIG. 11 is a schematic drawing illustrating a layout structure of an ESD protection semiconductor device provided by another modification to the fourth preferred embodiment.

Please refer to FIG. 11, which is a schematic drawing illustrating layout structure of an ESD protection semiconductor device provided by another modification to the fourth preferred embodiment. It should be noted that elements the same in the present modification and the fourth preferred embodiment are designated by the same numerals and include the same material choice and electrical relationships, therefore those details are omitted for simplicity. The difference between the modification and the preferred embodiments is detailed: In the ESD protection semiconductor device 400b of the present modification, the placement of the isolation structure 440 is different from the fourth preferred embodiment. Consequently, a current direction is changed. However, the diode is still successfully formed and thus bypass for ESD currents is still obtained. Furthermore, though the second doped fin 432 is formed in the source region 420S in the modification, the second doped fin 432 can be replaced by the source fin 422 if required.

Figure 12A:
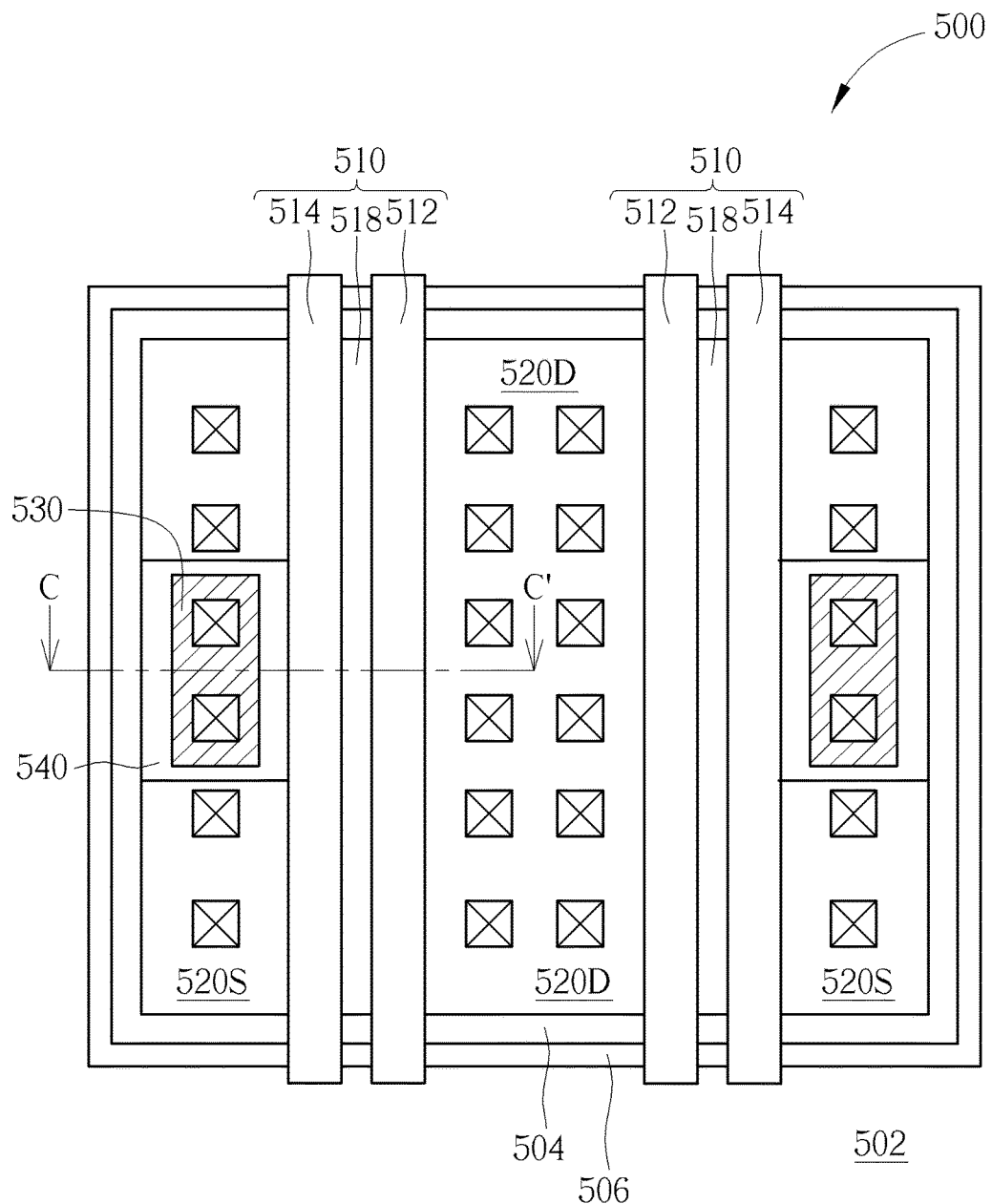
FIG. 12A is a schematic drawing illustrating a layout structure of an ESD protection semiconductor device provided by a fifth preferred embodiment of the present invention.
Figure 12B:
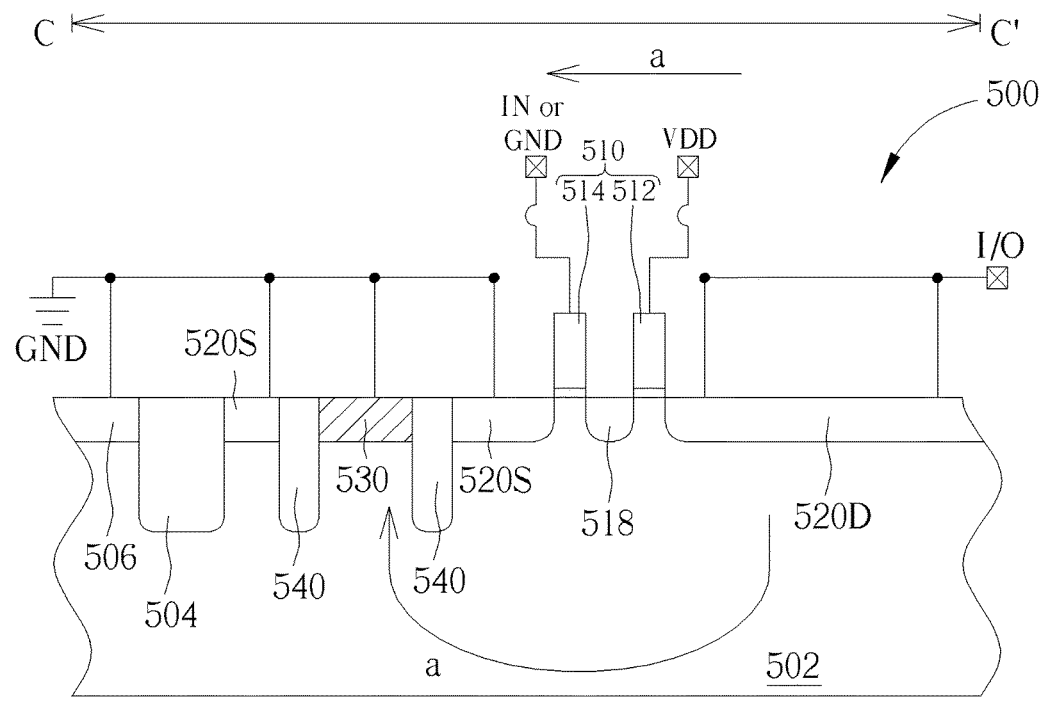
FIG. 12B is a schematic drawing illustrating the ESD protection semiconductor device provided by the fifth preferred embodiment and also is a cross-sectional view taken along a Line C-C' of FIG. 12A.

Please refer to FIGS. 12A-12B, wherein FIG. 12A is a schematic drawing illustrating a layout structure of an ESD protection semiconductor device provided by a fifth preferred embodiment of the present invention, and FIG. 12B is a schematic drawing illustrating the ESD protection semiconductor device provided by the fifth preferred embodiment and also is a cross-sectional view taken along a Line C-C' of FIG. 12A. As shown in FIG. 12A and FIG. 12B, the ESD protection semiconductor device 500 provided by the preferred embodiment includes a substrate, and the substrate includes a well region 502. A gate set 510 is positioned on the substrate and the well region 502. In the preferred embodiment, the gate set 510 includes a first gate structure 512, a second gate structure 514 and a third doped region 518. As shown in FIG. 12A and FIG. 12B, the third doped region 518 is positioned in between the first gate structure 512 and the second gate structure 514. Therefore the first gate structure 512 and the second gate structure 514 are physically spaced apart from each other by the third doped region 518. However, the first gate structure 512 and the second gate structure 514 are electrically connected to each other by the third doped region 518. It is well-known to those skilled in the art that the first gate structure 512 and the second gate structure 514 respectively include a gate conductive layer and a gate dielectric layer, and since materials for the gate conductive layer and the gate dielectric layer are well-known to those skilled in the art, those details are omitted in the interest of brevity. According to the preferred embodiment, the ESD protection semiconductor device 500 further includes a source region 520S and a drain region 520D formed in the substrate/the well region 502 respectively at two sides of the gate set 510. As shown in FIG. 12A and FIG. 12B, the first gate structure 512 is positioned in between the third doped region 518 and the drain region 520D while the second gate structure 514 is positioned in between the third doped region 518 and the source region 520S. The source region 520S, the drain region 520D and the third doped region 518 include a first conductivity type while the well region 502 includes a second conductivity type, and the first conductivity type and the second conductivity type are complementary to each other. For example, the first conductivity type is an n type and the second conductivity type is a p type in the preferred embodiment. However, as mentioned above, the first conductivity type can be the p type and the second conductivity type can be the n type. Furthermore, the ESD protection semiconductor device 500 includes an isolation structure 504 and a guard ring 506 including the second conductivity type. The isolation structure 504 and the guard ring 506 surround the ESD protection semiconductor device 500 and electrically isolate the ESD protection semiconductor device 500 from other device. In the preferred embodiment, the isolation structure 504 preferably includes a STI structure, but not limited to this.

Please still refer to FIG. 12A and FIG. 12B. The ESD protection semiconductor device 500 provided by the preferred embodiment further includes at least a doped region 530 formed in the source region 520S. It is noteworthy that though the doped region 530 is formed in the source region 520S, the doped region 530 is spaced apart from the source region 520S by a blocking structure 540. As shown in FIG. 12A and FIG. 12B, the blocking structure 540 surrounds the doped region 530 and therefore isolates the doped region 530 from the source region 520S. In the preferred embodiment, the blocking structure 540 includes a STI structure. However, the blocking structure 540 can include dummy gate or SAB layer. Also, the first blocking structure 540 can include a STI-dummy gate mixed blocking structure or a STI-SAB mixed blocking structure. As mentioned above, the first doped region 530 includes the second conductivity type. That is, the preferred embodiment provides a p-typed doped region 530 formed in the n-source region 520S.

Please refer to FIG. 12A and FIG. 12B. More important, the doped region 530 formed in the source region 520S is electrically connected to a ground potential GND. When an ESD event occurs, the n-drain region 520D, the p-well region 502 and the p-typed doped region 530 construct a diode. Consequently, the ESD current is bypassed from the drain region 520D to the doped region 530, which is electrically connected to the ground potential GND. Briefly speaking, the preferred embodiment provides at least a diode for bypassing the ESD currents.

Please refer to FIG. 13, which is a schematic drawing illustrating an ESD protection semiconductor device provided by a modification to the present invention. It should be noted that elements the same in the present modification and the fifth preferred embodiment are designated by the same numerals and include the same material choice and electrical relationships, therefore those details are omitted for simplicity. More important, the present modification is provided not only for the fifth preferred embodiment, but also for any preferred embodiment provided by the present invention. As shown in FIG. 13, the difference between the modification and the preferred embodiments is detailed: Since both of the doped region 530 and the source region 520S are electrically connected to the ground potential GND, blocking structure is omitted or eliminated from the doped region 530 and the source region 520S. Briefly speaking, the doped region 530 can be formed to contact the source region 520S.

Accordingly, the ESD protection semiconductor device 500 provided by the preferred embodiment is a cascade transistor device including at least a diode. Consequently, the ESD currents can be bypassed by the diode, and thus the threshold voltage of the ESD protection semiconductor device 500 is efficaciously reduced and the turn-on speed is improved. Since the diode serves as the bypass for ESD, damage caused by ESD event is avoided and thus device robustness of the ESD protection semiconductor device 500 is improved. More important, since the bypasses are self-triggered BJTs, no leakage is found when the ESD protection semiconductor device 500 is turned off. Additionally, according to the preferred embodiment, formation of the doped region 530 can be integrated in the state-of-the-art semiconductor manufacturing process without increasing process complexity and cost.

Figure 14:
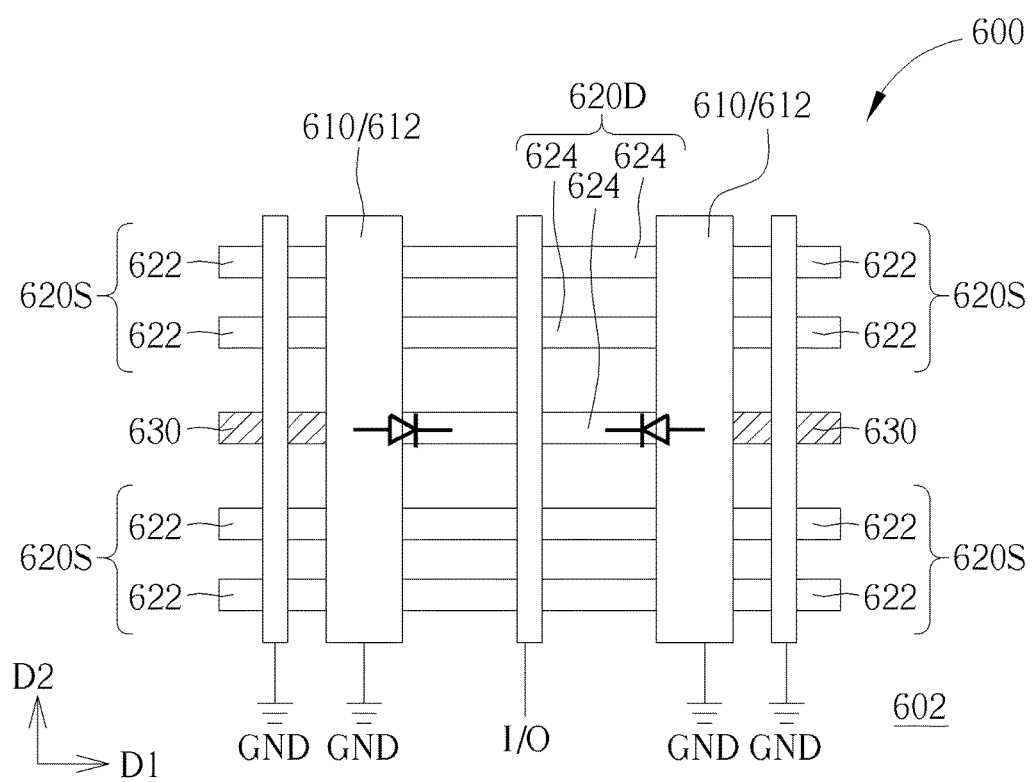
FIG. 14 is a schematic drawing illustrating a layout structure of an ESD protection semiconductor device provided by a sixth preferred embodiment of the present invention.

Please refer to FIG. 14, which is a schematic drawing illustrating a layout structure of an ESD protection semiconductor device provided by a sixth preferred embodiment of the present invention. As shown in FIG. 14, the ESD protection semiconductor device 600 provided by the preferred embodiment includes a substrate 602, and a gate set 610 is positioned on the substrate 602. In the preferred embodiment, the gate set 610 includes a single gate structure 612. It is well-known to those skilled in the art that the single gate structure 612 includes a gate conductive layer and a gate dielectric layer, and since materials for the gate conductive layer and the gate dielectric layer are well-known to those skilled in the art, those details are omitted in the interest of brevity. Additionally, the gate set 610 can include two gate structures, three gate structures, or the gate group(s) as mentioned above. The amount and arrangement of the gate set 610 can be modified as mentioned above, and thus details are all omitted for simplicity. As shown in FIG. 14, the ESD protection semiconductor device 600 further includes a source region 620S and a drain region 620D formed in the substrate 602 respectively at two sides of the gate set 610. It is noteworthy that according to the preferred embodiment, the source region 620S includes a plurality of source fins 622 and the drain region 620D includes a plurality of drain fins 624. As shown in FIG. 14, the source fins 622 are parallel with each other, and the drain fins 624 are parallel with each other. In the preferred embodiment, the source fins 622 and the drain fins 6424 can be formed on the substrate 402 by performing multiple patterning process, such as, for example but not limited to, double patterning process. The source fins 622 and the drain fins 624 are extended along a first direction D1, and arranged along a second direction D2. The first direction D1 is perpendicular to the second direction D2. The gate set 610 is extended along the second direction D2. Furthermore, the gate set 610 covers a portion of the fins.

Please still refer to FIG. 14. At least a doped fin 630 is formed in the source region 620S. As shown in FIG. 14, the doped fin 630 is parallel with the source fins 622. Furthermore, the doped fin 630 is physically spaced apart from the source fins 622. The source region 620S (including all of the source fins 622), the drain region 620D (including all of the drain fins 624) include a first conductivity type while the doped fin 630 and the substrate 602 include a second conductivity type, and the first conductivity type and the second conductivity type are complementary to each other. For example, the first conductivity type is an n type and the second conductivity type is a p type in the preferred embodiment, but not limited to this.

More important, the doped fin 630 formed in the source region 620S is electrically connected to a ground potential GND. Furthermore, the gate set 610 (that is the single gate structure 612) and the source region 620S are electrically connected to a ground potential GND, and the drain region 620D is electrically connected to an input/output pad I/O. According to the preferred embodiment, when an ESD event occurs, the ESD surges will be diverted to the ground by the gate set 610/612, which is electrically connected to the ground potential GND. More important, the n-drain region 620D, the p-substrate 602 and the p-typed doped fin 630 construct a diode. Consequently, the ESD current is bypassed from the drain region 620D to the doped fin 630, which is electrically connected to the ground potential GND. Briefly speaking, the preferred embodiment provides at least a diode for bypassing the ESD currents.

Accordingly, the ESD protection semiconductor device 600 provided by the preferred embodiment is a FinFET including a diode. Consequently, the ESD currents can be bypassed by the diode, and thus the threshold voltage of the ESD protection semiconductor device 600 is efficaciously reduced and the turn-on speed is improved. Since the diode serves as the bypass for ESD, damage caused by ESD event is avoided and thus device robustness of the ESD protection semiconductor device 600 is improved. More important, no leakage is found when the ESD protection semiconductor device 6 is turned off. Additionally, according to the preferred embodiment, formation of the doped fin 630 can be integrated in the state-of-the-art semiconductor manufacturing process without increasing process complexity and cost.

Figure 15A:
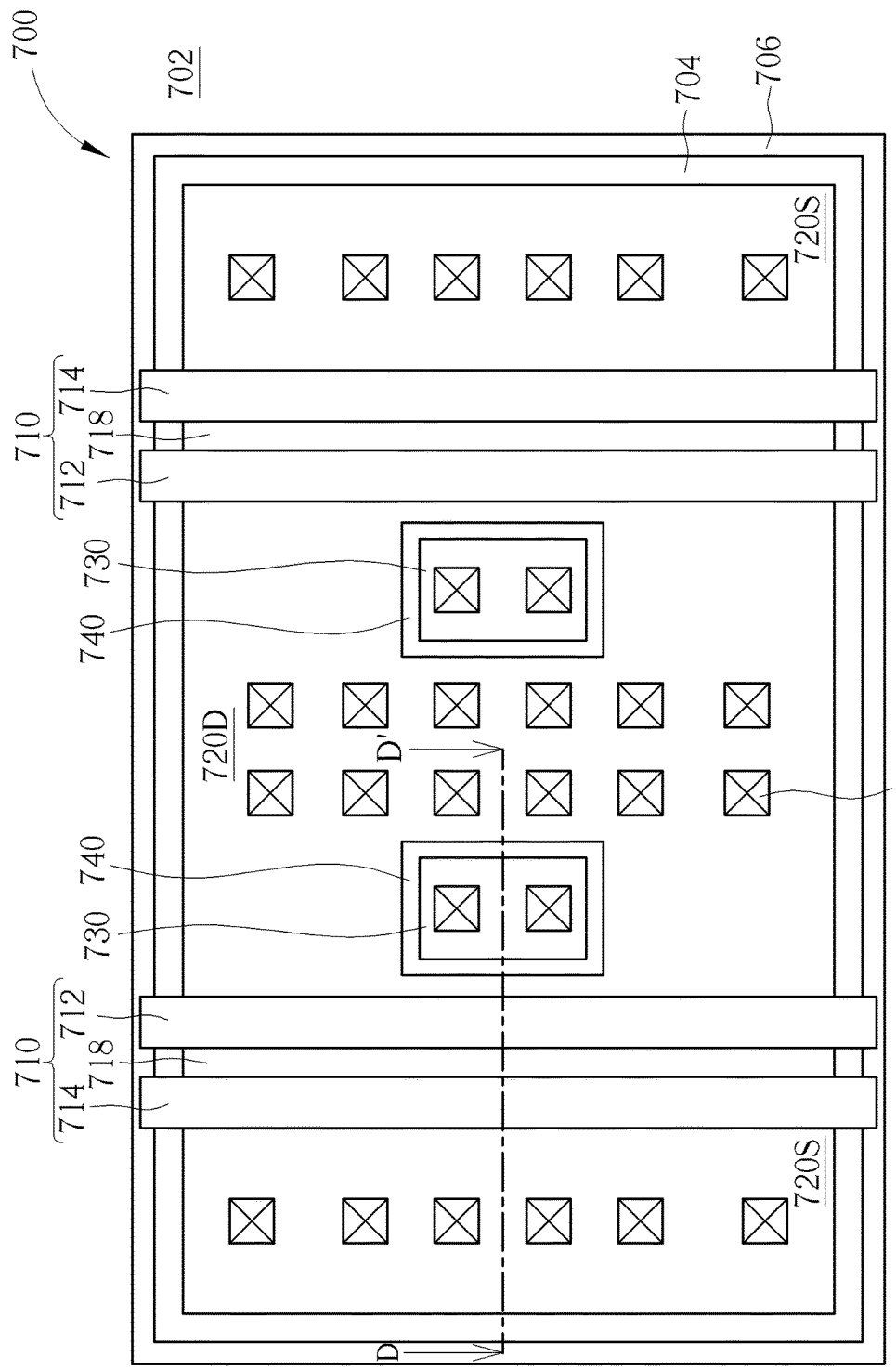
FIG. 15A is a schematic drawing illustrating a layout structure of an ESD protection semiconductor device provided by a seventh preferred embodiment of the present invention.
Figure 15B:
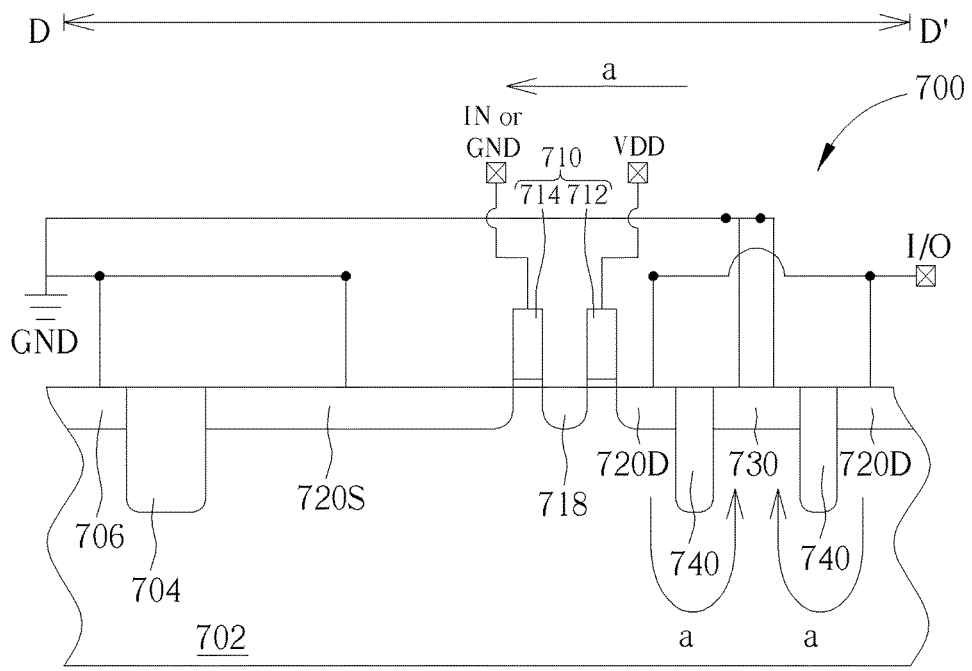
FIG. 15B is a schematic drawing illustrating the ESD protection semiconductor device provided by the seventh preferred embodiment and also is a cross-sectional view taken along a Line D-D' of FIG. 15A.
Figure 15C:
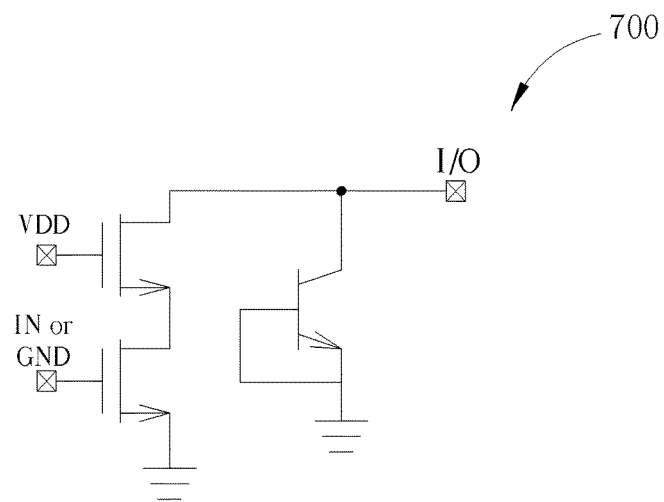
FIG. 15C is a circuit diagram of the ESD protection semiconductor device provided by the seventh preferred embodiment.

Please refer to FIGS. 15A-15C, wherein FIG. 15A is a schematic drawing illustrating a layout structure of an ESD protection semiconductor device provided by a seventh preferred embodiment of the present invention, FIG. 15B is a schematic drawing illustrating the ESD protection semiconductor device provided by the seventh preferred embodiment and also is a cross-sectional view taken along a Line D-D' of FIG. 15B, and FIG. 15C is a circuit diagram of the ESD protection semiconductor device provided by the seventh preferred embodiment. As shown in FIG. 15A and FIG. 15B, the ESD protection semiconductor device 700 provided by the preferred embodiment includes a substrate, and the substrate includes a well region 702. A gate set 710 is positioned on the substrate and the well region 702. In the preferred embodiment, the gate set 710 includes a first gate structure 712, a second gate structure 714 and a third doped region 718. As shown in FIG. 15A and FIG. 15B, the third doped region 718 is positioned in between the first gate structure 712 and the second gate structure 714. Therefore the first gate structure 712 and the second gate structure 714 are physically spaced apart from each other by the third doped region 718. However, the first gate structure 712 and the second gate structure 714 are electrically connected to each other by the third doped region 718. It is well-known to those skilled in the art that the first gate structure 712 and the second gate structure 714 respectively include a gate conductive layer and a gate dielectric layer, and since materials for the gate conductive layer and the gate dielectric layer are well-known to those skilled in the art, those details are omitted in the interest of brevity. Additionally, the gate set 710 can include two gate structures, three gate structures, or the gate group(s) as mentioned above. The amount and arrangement of the gate set 710 can be modified as mentioned above, and thus details are all omitted for simplicity. According to the preferred embodiment, the ESD protection semiconductor device 700 further includes a source region 720S and a drain region 720D formed in the substrate/the well region 702 respectively at two sides of the gate set 710. As shown in FIG. 15A and FIG. 15B, the first gate structure 712 is positioned in between the third doped region 718 and the drain region 720D while the second gate structure 714 is positioned in between the third doped region 718 and the source region 720S. The source region 720S, the drain region 720D and the third doped region 718 include a first conductivity type while the well region 702 includes a second conductivity type, and the first conductivity type and the second conductivity type are complementary to each other. For example, the first conductivity type is an n type and the second conductivity type is a p type in the preferred embodiment. However, as mentioned above, the first conductivity type can be the p type and the second conductivity type can be the n type. Furthermore, the ESD protection semiconductor device 700 includes an isolation structure 704 and a guard ring 706 including the second conductivity type. The isolation structure 704 and the guard ring 706 surround the ESD protection semiconductor device 700 and electrically isolate the ESD protection semiconductor device 700 from other device. In the preferred embodiment, the isolation structure 704 preferably includes a STI structure, but not limited to this.

Please still refer to FIG. 15A and FIG. 15B. The ESD protection semiconductor device 700 provided by the preferred embodiment further includes at least a first doped region 730 formed in the drain region 720D. More important, the first doped region 730 is positioned in between drain contact plugs 722C and the gate set 710. It is noteworthy that though the first doped region 730 is formed in the drain region 720D, the first doped region 730 is spaced apart from the drain region 720D by a first blocking structure 740. As shown in FIG. 15A and FIG. 15B, the first blocking structure 740 surrounds the first doped region 730 and therefore isolates the first doped region 730 from the drain region 720D. In the preferred embodiment, the first blocking structure 740 includes a STI structure. However, the first blocking structure 740 can include dummy gate, SAB layer, STI-dummy gate mixed blocking structure, or STI-SAB mixed blocking structure. In the preferred embodiment, the first doped region 730 includes the first conductivity type. That is, the preferred embodiment provides an n-typed first doped region 730 formed in the n-drain region 720D.

Please refer to FIG. 15B and FIG. 15C. More important, the first doped region 730 formed in the drain region 720D is electrically connected to a ground potential GND. Furthermore, in the gate set 710, the first gate structure 712 is electrically connected to a power supply pad (Vdd pad) VDD while the second gate structure 714 is electrically connected to a ground potential GND or a signal input pad IN. The source region 720S and the guard ring 706 are electrically connected to a ground potential GND, and the drain region 720D is electrically connected to an input/output pad I/O. As shown in FIG. 15B and FIG. 15C, when an ESD event occurs, the ESD surges will be diverted to the ground by the second gate structure 714, which is electrically connected to the ground potential GND. More important, the n-drain region 720D, the p-well region 702 and the n-typed first doped region 730 construct an npn-BJT. Consequently, the ESD current is bypassed from the drain region 720D to the first doped region 730, which is electrically connected to the ground potential GND, as arrows "a" depicted. Briefly speaking, the preferred embodiment provides at least an npn-BJT for bypassing the ESD currents.

Figure 16:
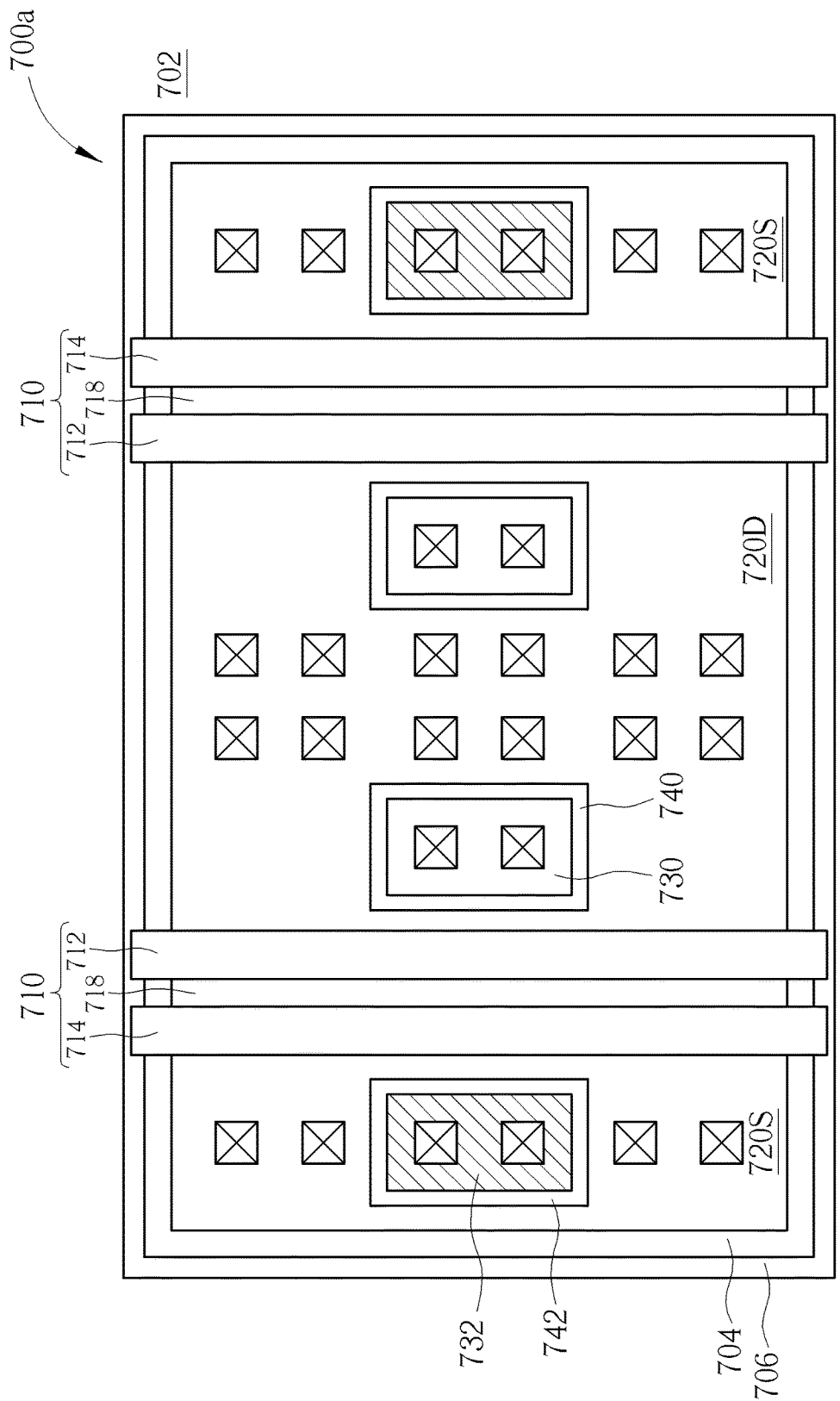
FIG. 16 is a schematic drawing illustrating layout structure of an ESD protection semiconductor device provided by a modification to the seventh preferred embodiment.

Please refer to FIG. 16, which is a schematic drawing illustrating layout structure of an ESD protection semiconductor device provided by a modification to the seventh preferred embodiment. It should be noted that elements the same in the present modification and the seventh preferred embodiment are designated by the same numerals and include the same material choice and electrical relationships, therefore those details are omitted for simplicity. As shown in FIG. 16, the difference between the modification and the preferred embodiments is detailed: The ESD protection semiconductor device 700a provided by the present modification further includes a second doped region 732 formed in the source region 720S. And the second doped region 732 includes the second conductivity type. Though the second doped region 732 is formed in the source region 720S, the second doped region 732 is physically spaced apart from the source region 720S by a second blocking structure 742: the second blocking structure 742 surrounds the second doped region 732 and therefore isolates the second doped region 732 from the source region 1705.

Figure 17:
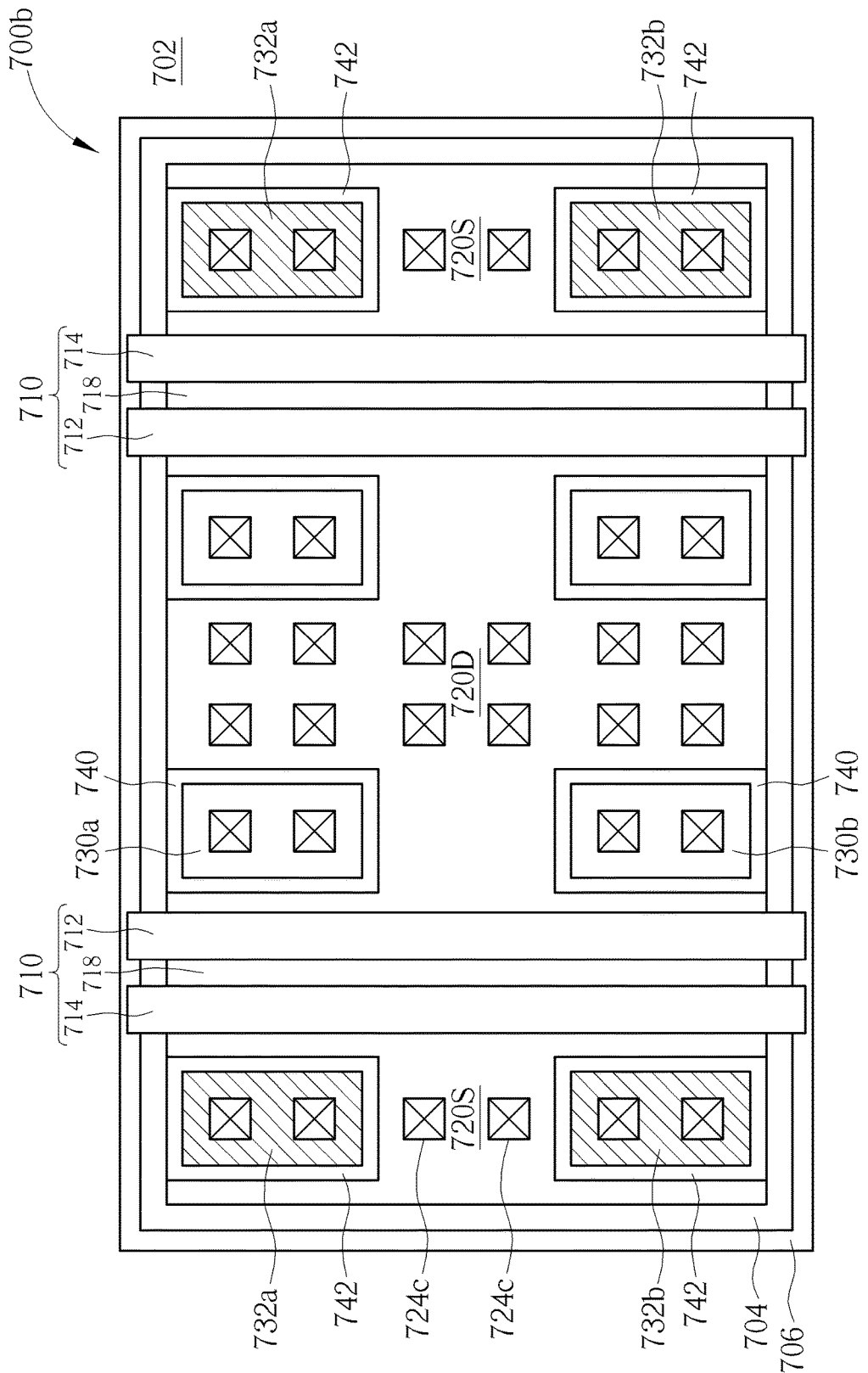
FIG. 17 is a schematic drawing illustrating layout structure of an ESD protection semiconductor device provided by another modification to the seventh preferred embodiment.

Please refer to FIG. 17, which is a schematic drawing illustrating layout structure of an ESD protection semiconductor device provided by another modification to the seventh preferred embodiment. It should be noted that elements the same in the present modification and the seventh preferred embodiment are designated by the same numerals and include the same material choice and electrical relationships, therefore those details are omitted for simplicity. As shown in FIG. 17, the difference between the modification and the preferred embodiments is detailed: In the ESD protection semiconductor device 700b, the first doped region further includes a pair of sub-first doped regions 730a/730b. The sub-first doped regions 730a/730b are respectively positioned in between drain contact plugs 722C and the gate set 710. More important, the sub-first doped regions 730a/730b are respectively formed at two opposite ends of the drain region 720D.

Additionally, a second doped region can be formed in the source region 720S if required. And the second doped region can include a pair of sub-second doped regions 732a/732b. As shown in FIG. 17, the sub-second doped regions 732a/732b are respectively formed at two opposite ends of the source region 720S.

Figure 18:
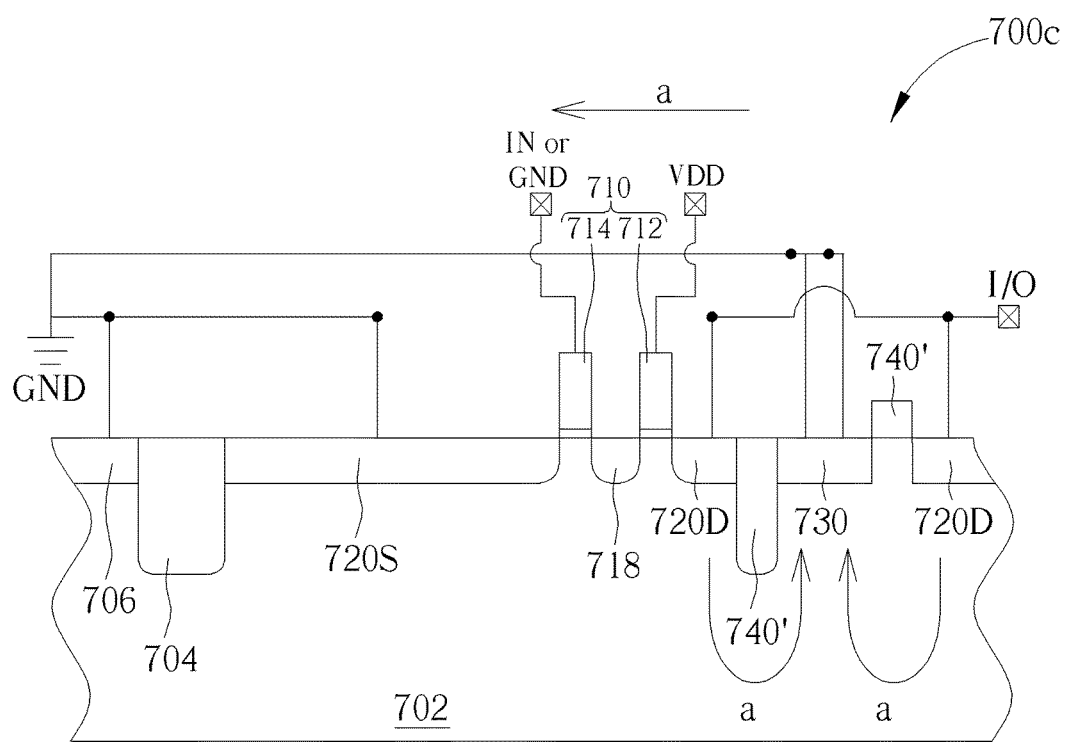
FIG. 18 is a schematic drawing illustrating layout structure of an ESD protection semiconductor device provided by still another modification to the seventh preferred embodiment.

Please refer to FIG. 18, which is a schematic drawing illustrating layout structure of an ESD protection semiconductor device provided by still another modification to the seventh preferred embodiment. It should be noted that elements the same in the present modification and the seventh preferred embodiment are designated by the same numerals and include the same material choice and electrical relationships, therefore those details are omitted for simplicity. As shown in FIG. 18, the difference between the modification and the preferred embodiments is detailed: According to the ESD protection semiconductor device 700c provided by the modification, the first blocking structure includes a mixed type blocking structure 740'. Specifically, the mixed type blocking structure 740' can include a STI-dummy gate mixed blocking structure or a STI-SAB mixed blocking structure. It should be noted that in the modification, the mixed type blocking structure 740' preferably includes the STI at the side near the gate set 710 such that electrical isolation is ensured. According to the modification, the dummy gate or the SAB can serve as implant mask and thus no doped region is formed under the dummy gate or the SAB. Therefore, as shown in FIG. 18, the first doped region 730 is isolated from the drain region 720D by the mixed type blocking structure 740' and the substrate 702 formed underneath.

In the same concept, in some modifications that a second doped region 732 is formed in the source region 720S, the second blocking structure (not shown) surrounding the second doped region 732 can include the abovementioned mixed type blocking structure. Furthermore, the mixed type blocking structure preferably includes the STI at the side near the gate set 710 such that electrical isolation is ensured. According to the modification, the dummy gate or the SAB can serve as implant mask and thus no doped region is formed under the dummy gate or the SAB. Therefore, the second doped region 732 is isolated from the source region 720S by the mixed type blocking structure and the substrate 702 formed underneath. However, since both of the second doped region 732 and the source region 720S are electrically connected to the ground potential GND, the blocking structure originally disposed in between the second doped region 732 and the source region 720S can be eliminated as mentioned above.

Accordingly, the ESD protection semiconductor device 700/700a/700b/700c provided by the preferred embodiment and its modifications is a cascade transistor device including at least a BJT. Consequently, the ESD currents can be bypassed by the BJT, and thus the threshold voltage of the ESD protection semiconductor device 700/700a/700b/700c is efficaciously reduced and the turn-on speed is improved. Since the BJT serves as the bypass for ESD, damage caused by ESD event is avoided and thus device robustness of the ESD protection semiconductor device 700/700a/700b/700c is improved. More important, no leakage is found when the ESD protection semiconductor device 700/700a/700b/700c is turned off. Additionally, according to the preferred embodiment, formation of the first doped region 730 and the second doped region 732 can be integrated in the state-of-the-art semiconductor manufacturing process without increasing process complexity and cost.

According to the ESD protection semiconductor device provided by the present invention, the first doped region (including the first conductivity type or alternatively the second conductivity type) formed in the drain region or alternatively in the source region is electrically connected to the ground potential GND, and thus at least a diode or a BJT is obtained. Consequently, the threshold voltage of the ESD protection semiconductor device is reduced while the turn-on speed, the device robustness, and MM ESD tolerance of the ESD protection semiconductor device are improved. Furthermore, the ESD protection semiconductor device provided by the present invention includes the gate set, and the gate set can include the single gate, the multi gate, or the multi gate group. Therefore, the ESD protection semiconductor device provided by the present invention is able to be integrated into single-gate MOS transistor device, cascode transistor device, multi-gate MOS transistor. Additionally, by forming well regions of different conductivity types in the substrate, the ESD protection semiconductor device provided by the present invention is able to be integrated with LDMOS transistor approach. Furthermore, the ESD protection semiconductor device provided by the present invention is able to be integrated into FinFET approaches. In other words, the ESD protection semiconductor device provided by the present invention is able to be integrated with various transistor approaches, thus product flexibility and functionality of the ESD protection semiconductor device are both improved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An electrostatic discharge (ESD) protection semiconductor device comprising:
 a substrate;
 a gate set formed on the substrate;
 a source region and a drain region formed in the substrate respectively at two sides of the gate set, and the source region and the drain region comprising a first conductivity type, wherein the drain region is electrically connected to an input/out (I/O) pad;
 at least a first doped region formed in the drain region; the first doped region comprising a second conductivity type complementary to the first conductivity type, and the first doped region being electrically connected to a ground potential, wherein the gate set is disposed in between the source region and the first doped region; and
 a first blocking structure surrounding the first doped region and isolating the first doped region from the drain region.

2. The ESD protection semiconductor device according to claim 1, wherein the first blocking structure comprises shallow trench isolation (STI), dummy gate, or salicide blocking (SAB) layer.

3. The ESD protection semiconductor device according to claim 2, wherein the first blocking structure comprises a STI-dummy gate mixed blocking structure or a STI-SAB mixed blocking structure.

4. The ESD protection semiconductor device according to claim 1, further comprising a second doped region formed in the source region, and the second doped region comprising the second conductivity type.

5. The ESD protection semiconductor device according to claim 4, further comprising a second blocking structure surrounding the second doped region and isolating the second doped region from the source region.

6. The ESD protection semiconductor device according to claim 5, wherein the second blocking structure comprises STI, dummy gate, or SAB layer.

7. The ESD protection semiconductor device according to claim 1, wherein the gate set comprises a single gate structure, the single gate structure and the source region are electrically connected to a ground potential, and the drain region is electrically connected to an input/output (I/O) pad.

8. The ESD protection semiconductor device according to claim 1, wherein the gate set comprises:
 a third doped region comprising the first conductivity type;
 a first gate structure positioned on the substrate and between the third doped region and the drain region; and
 a second gate structure positioned on the substrate and between the third doped region and the source region.

9. The ESD protection semiconductor device according to claim 8, wherein the first gate structure and the second gate structure are physically spaced apart from each other by the third doped region, and the first gate structure and the second gate structure are electrically connected to each other by the third doped region.

10. The ESD protection semiconductor device according to claim 1, further comprising:
   a first well region formed in the substrate, the first well region comprising the first conductivity type; and
   a second well region formed in the substrate, the second well region comprising the second conductivity type,
   wherein the first well region and the second well region are spaced apart from each other by the substrate.

11. The ESD protection semiconductor device according to claim 10, wherein the drain region and the first doped region are formed in the first well region, and the source region is formed in the second well region.

12. The ESD protection semiconductor device according to claim 10, further comprising a second doped region formed in the source region in the second well region, and the second doped region comprising the second conductivity type.

13. The ESD protection semiconductor device according to claim 1, wherein the source region comprises a plurality of source fins parallel with each other, and the drain region comprises a plurality of drain fins parallel with each other.

14. The ESD protection semiconductor device according to claim 13, wherein the first doped region further comprises at least a first doped fin, and the first doped fin is parallel with the drain fins and physically spaced apart from the drain fins.

* * * * *